(12) United States Patent
Jeon et al.

(10) Patent No.: US 10,861,918 B2
(45) Date of Patent: Dec. 8, 2020

(54) ORGANIC LIGHT EMITTING DIODE DISPLAY DEVICE

(71) Applicant: SAMSUNG DISPLAY CO., LTD., Yongin-si (KR)

(72) Inventors: Joohee Jeon, Yongin-si (KR); Gun Hee Kim, Yongin-si (KR); Do Hyung Kim, Yongin-si (KR); Hyeonsik Kim, Yongin-si (KR); Sangho Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/277,221

(22) Filed: Feb. 15, 2019

(65) Prior Publication Data

US 2019/0259822 A1 Aug. 22, 2019

(30) Foreign Application Priority Data

Feb. 19, 2018 (KR) ........................ 10-2018-0019566

(51) Int. Cl.
*H01L 27/32* (2006.01)
*H01L 51/52* (2006.01)
*H01L 51/00* (2006.01)
*H01L 29/786* (2006.01)
*H01L 27/12* (2006.01)

(52) U.S. Cl.
CPC ...... *H01L 27/3262* (2013.01); *H01L 27/1218* (2013.01); *H01L 27/1248* (2013.01); *H01L 27/1259* (2013.01); *H01L 27/3276* (2013.01); *H01L 29/78603* (2013.01); *H01L 29/78633* (2013.01); *H01L 51/0097* (2013.01); *H01L 51/5253* (2013.01); *H01L 27/1214* (2013.01); *H01L 2227/323* (2013.01); *H01L 2227/326* (2013.01); *H01L 2251/5338* (2013.01)

(58) Field of Classification Search
CPC ........... H01L 27/3262; H01L 29/78603; H01L 27/1259; H01L 27/1248; H01L 27/1218; H01L 29/78633; H01L 51/5253; H01L 51/0097; H01L 27/3276; H01L 2251/5338; H01L 2227/323; H01L 2227/326; H01L 27/1214
See application file for complete search history.

(56) References Cited

U.S. PATENT DOCUMENTS 9,502,486 B2 11/2016 Lee et al.
2017/0207288 A1* 7/2017 Kang .................. H01L 27/3276

FOREIGN PATENT DOCUMENTS

| KR | 10-2003-0028206 A | 4/2003 |
|---|---|---|
| KR | 10-0795810 B1 | 1/2008 |
| KR | 10-2013-0008659 A | 1/2013 |
| KR | 10-2016-0002337 A | 1/2016 |
| KR | 10-2017-0078075 A | 7/2017 |
| KR | 20180060311 A * | 6/2018 |

* cited by examiner

*Primary Examiner* — Edward Chin
(74) *Attorney, Agent, or Firm* — Kile Park Reed & Houtteman PLLC

(57) ABSTRACT

An organic light emitting diode display device includes a substrate, a driving transistor, and a sub-pixel structure. The substrate has a first trench. The driving transistor is inside the first trench of the substrate. The sub-pixel structure is on the driving transistor.

19 Claims, 17 Drawing Sheets

ORGANIC LIGHT EMITTING DIODE DISPLAY DEVICE

CROSS-REFERENCE TO RELATED APPLICATION

Korean Patent Application No. 10-2018-0019566, filed on Feb. 19, 2018, in the Korean Intellectual Property Office, and entitled: "Organic Light Emitting Diode Display Device," is incorporated by reference herein in its entirety.

BACKGROUND

1. Field

Example embodiments relate generally to an organic light emitting diode display device. More particularly, embodiments relate to a flexible organic light emitting diode display device.

2. Description of the Related Art

A flat panel display ("FPD") device is widely used as a display device of an electronic device because the FPD device is lightweight and thin compared to a cathode-ray tube ("CRT") display device. Typical examples of the FPD device are a liquid crystal display ("LCD") device and an organic light emitting diode ("OLED") display device.

The OLED display device may include a plurality of transistors (e.g., driving transistors and switching transistors), a plurality of capacitors, a plurality of wirings (e.g., scan signal wirings, data signal wirings, emission signal wirings, initialization signal wirings, power supply voltage wirings, etc.), a plurality of sub-pixel structures, etc, and a flexible OLED display device capable of bending or folding a portion of the OLED display device including lower and upper substrates having flexible materials may have been developed.

SUMMARY

According to some example embodiments, an OLED display device includes a substrate, a driving transistor, and a sub-pixel structure. The substrate has a first trench. The driving transistor is inside the first trench of the substrate. The sub-pixel structure is on the driving transistor.

In example embodiments, a width of the first trench may be greater than a width of the driving transistor.

In example embodiments, the OLED display device may further include a first lower block pattern under the driving transistor, and the first lower block pattern may be buried in the internal substrate.

In example embodiments, the OLED display device may further include a first switching transistor on the substrate, and the driving transistor may be at a lower level than the first switching transistor.

In example embodiments, the substrate may include a first organic film layer, a first barrier layer on the first organic film layer, a second organic film layer on the first barrier layer and having a first opening under the driving transistor, and a second barrier layer on the second organic film layer.

In example embodiments, the first trench of the substrate may be defined by the first opening of the second organic film layer.

In example embodiments, the second barrier layer may be in the first opening of the second organic film layer.

In example embodiments, the OLED display device may further include a first switching transistor on the substrate. The driving transistor may be at a lower level than the first switching transistor, and the first and second organic film layers of the substrate may be under the driving transistor.

In example embodiments, the OLED display device may further include a second switching transistor inside the first trench, and the second switching transistor may be spaced apart from the driving transistor.

In example embodiments, the OLED display device may further include a first lower block pattern and a second lower block pattern. The first lower block pattern may be inside the first trench under the driving transistor and between the first barrier layer and the second barrier layer. The second lower block pattern may be inside the first trench under the second transistor and between the first barrier layer and the second barrier layer.

In example embodiments, the first organic film layer may further include a first groove under the driving transistor.

In example embodiments, the first barrier layer may be in the first groove.

In example embodiments, the first trench of the substrate may be defined by the first groove of the first organic film layer and the first opening of the second organic film layer.

In example embodiments, the OLED display device may further include a first switching transistor and a first lower block pattern. The first switching transistor may be on the substrate at a higher level than the driving transistor. The first lower block pattern may be under the driving transistor and between the first barrier layer and the second barrier layer.

In example embodiments, the first organic film layer may further include a second groove spaced apart from the first groove in a first direction and a third groove spaced apart from the first groove in a second direction that is different from the first direction.

In example embodiments, the second organic film layer may further include a second opening that overlaps the second groove and a third opening that overlaps to the third groove, and the first barrier layer may be in the second and third grooves.

In example embodiments, a second trench of the substrate may be defined by the second groove of the first organic film layer and the second opening of the second organic film layer, and the third trench of the substrate may be defined by the third groove of the first organic film layer and the third opening of the second organic film layer.

In example embodiments, the OLED display device may further include a first signal wiring on the second trench and a second signal wiring the third trench, and a voltage level of the first signal may be less than a voltage level of the second signal wiring.

In example embodiments, the first organic film layer including the first, second, third grooves may be only under the driving transistor, the first signal wiring, and the second signal wiring.

In example embodiments, the OLED display device may further include a thin film encapsulation structure on the sub-pixel structure, and the substrate and the thin film encapsulation structure have flexibility.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
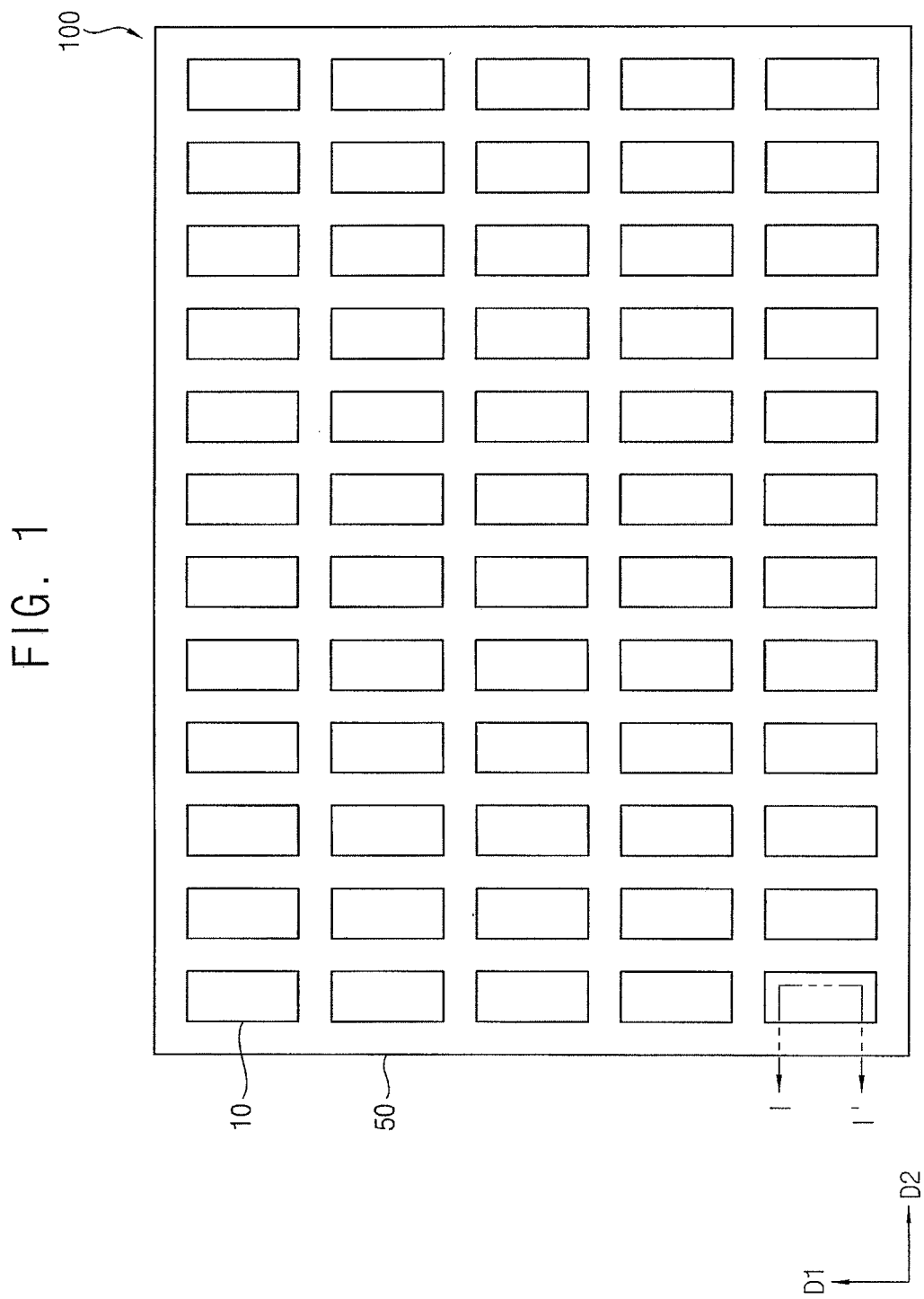
FIG. 1 illustrates a plan view of an organic light emitting diode ("OLED") display device in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
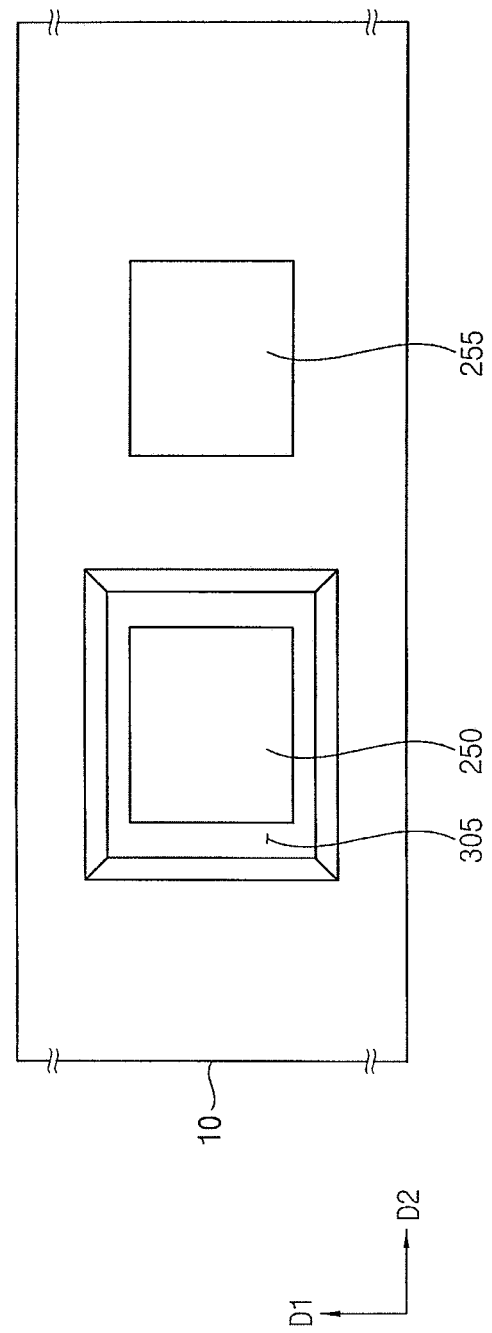
FIG. 2 illustrates a plan view for describing a trench included in the OLED display device of FIG. 1.

FIG. 1 is a plan view illustrating an organic light emitting diode ("OLED") display device in accordance with example embodiments. FIG. 2 is a plan view for describing a trench included in the OLED display device of FIG. 1.

Referring to FIGS. 1 and 2, an OLED display device 100 may have a display region 50 including a plurality of sub-pixel regions 10. Here, the sub-pixel regions 10 may be arranged in the entire display region 50 along first and second directions D1 and D2. Here, the first direction D1 may be perpendicular to the second direction D2, and both the first direction D and the second direction D2 may be parallel to an upper surface of the OLED display device 100.

Sub-pixel structures (e.g., a sub-pixel structure 200 of FIG. 3) may be in the sub-pixel regions 10, respectively.

Wirings may be in a remaining portion of the display region 50 except for the sub-pixel regions 10. For example, the wirings may include data signal wirings, scan signal wirings, emission signal wirings, initialization signal wirings, power supply voltage wirings, etc. Alternatively, the wirings may overlap the sub-pixel region 10.

In addition, at least one driving transistor 250 and at least one first switching transistor 255 may be in each of the sub-pixel regions 10. In example embodiments, a first trench 305 may be formed in each of the sub-pixel regions 10, and the driving transistor 250 may be inside the first trench 305. For example, as illustrated in FIG. 2, the driving transistor 250 may be inside of the first trench 305 in the sub-pixel region 10, and a shape of the first trench 305 may be formed along an outer profile of the driving transistor 250.

In example embodiments, a shape of each of the sub-pixel regions 10, the display region 50, the driving transistor 250, the first switching transistor 255, and the first trench 305 have a plan shape of a tetragon. Alternatively, a shape of each of the sub-pixel regions 10, the display region 50, the driving transistor 250, the first switching transistor 255, and the first trench 305 may have a plan shape of, e.g., a triangle, a diamond, a polygon, a circle, an athletic track, an elliptic, etc.

The first trench 305 in the sub-pixel region 10 may be formed by removing a second organic film layer of a substrate, which will be described below. As the second organic film layer under the driving transistor 250 is removed, electric charges included in the second organic film layers that may interfere with a drive of the driving transistor 250 maybe reduced. In example embodiments, as the OLED display device 100 includes the driving transistor 250 in the first trench 305, a threshold voltage of the driving transistor 250 may not be changed by the electric charges. Accordingly, reliability of the driving transistor 250 may be relatively improved, and rapid deterioration of the driving transistor 250 due to the change of the threshold voltage may be reduced or prevented.

Figure 3:
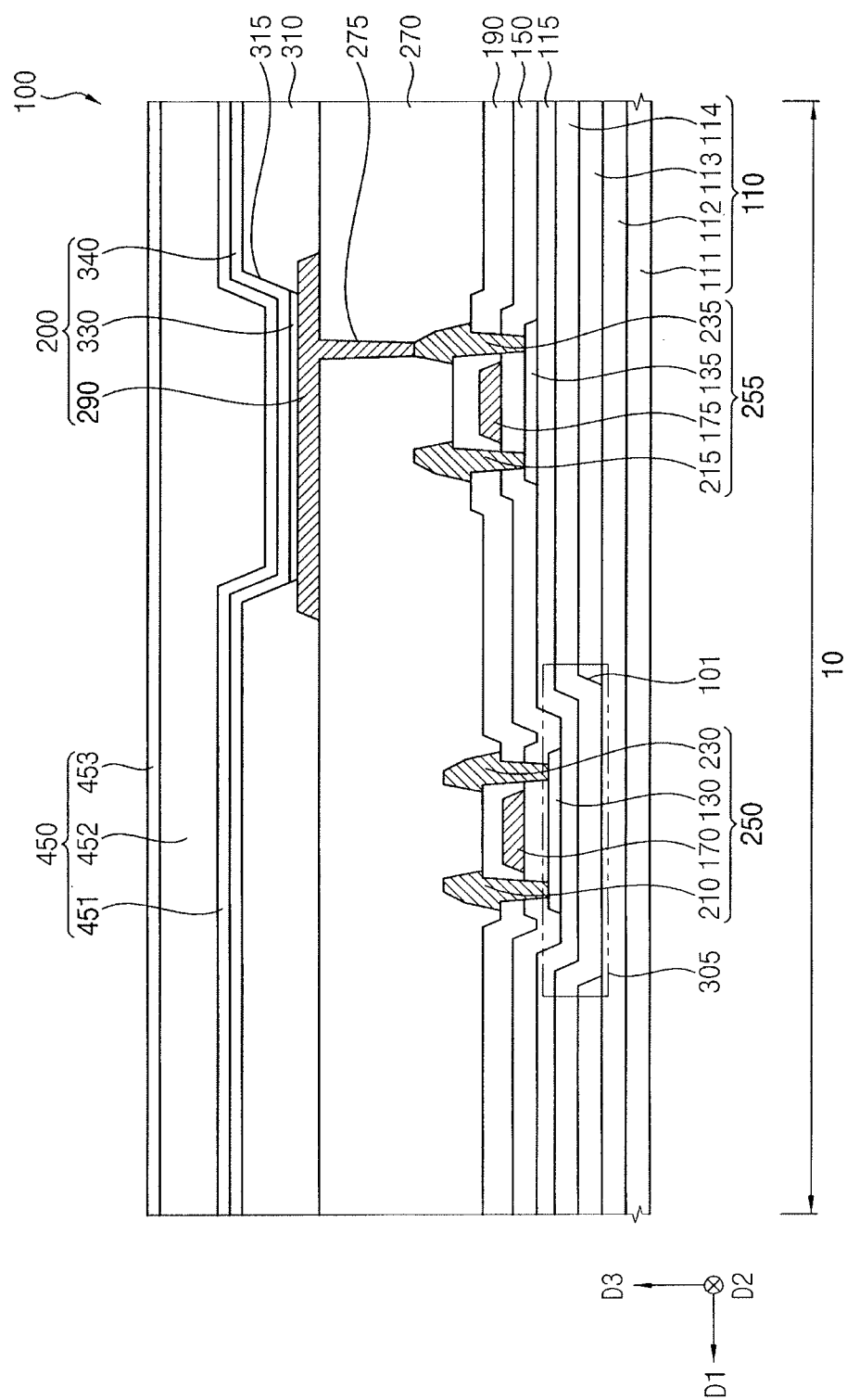
FIG. 3 illustrates a cross-sectional view taken along a line I-I' of FIG. 1.

FIG. 3 is a cross-sectional view taken along a line I-I' of FIG. 1. Referring to FIG. 3, the OLED display device 100 may include a substrate 110, a buffer layer 115, a gate insulation layer 150, an insulating interlayer 190, the driving transistor 250, the first switching transistor 255, the first trench 305, a planarization layer 270, a pixel defining layer 310, a sub-pixel structure 200, a thin film encapsulation ("TFE") structure 450, etc.

The driving transistor 250 may include a first active layer 130, a first gate electrode 170, a first source electrode 210, and a first drain electrode 230. The first switching transistor 255 may include a second active layer 135, a second gate electrode 175, a second source electrode 215, and a second drain electrode 235. The sub-pixel structure 200 may include a lower electrode 290, a light emitting layer 330, and an upper electrode 340. The TFE structure 450 may include a first TFE layer 451, a second TFE layer 452, and a third TFE layer 453. The substrate 110 may include a first organic film layer 111, a first barrier layer 112, a second organic film layer 113, and a second barrier layer 114. The second organic film layer 113 may have a first opening 101 that overlaps the driving transistor 250 along a third direction D3, perpendicular to the first and second directions D1 and D2. In example embodiments, the first trench 305 of the substrate 110 may be defined by the first opening 101 of the second organic film layer 113.

The substrate 110 may include transparent or opaque insulation materials. The substrate 110 may include a flexible transparent resin substrate. As described above, the substrate 110 may have the first organic film layer 111, the first barrier layer 112, the second organic film layer 113, and the second barrier layer 114 are sequentially stacked along the third direction D3. The second organic film layer 113 may have the first opening 101 exposing an upper surface of the first barrier layer 112. For example, the first barrier layer 112 may be on an entirety of the first organic film layer 111, and the second organic film layer 113 having the first opening 101 may be on the first barrier layer 112. In addition, the second barrier layer 114 may fill the first opening 101 of the second organic film layer 113, and may be on an entirety of the second organic film layer 113.

Each of the first barrier layer 112 and the second barrier layer 114 may include inorganic materials, e.g., a silicon compound, a metal oxide, etc. For example, each of the first barrier layer 112 and the second barrier layer 114 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc. In addition, each of the first organic film layer 111 and the second organic film layer 113 may include polyimide, epoxy-based resin, acryl-based resin, polyester, photoresist, polyacryl-based resin, polyimide-based resin, a polyamide-based resin, a siloxane-based resin, etc.

In example embodiments, the first and second barrier layers 112 and 114 each may include SiOx, and may block moisture or water that is permeated through the first and second organic film layers 111 and 113. Further, the first and second organic film layers 111 and 113 each may include a polyamide-based resin such that the OLED display device 100 has flexibility, and the polyimide-based resin may be random copolymer or block copolymer. The polyimide-based resin may have a high transparency, a low coefficient of thermal expansion, and a high glass transition temperature. Since the polyimide-based resin includes an imide radical, heat resistance, chemical resistance, durability, and an electrical characteristics thereof may be excellent.

Since the substrate 110 is relatively thin and flexible, the substrate 110 may be on a rigid glass substrate to help support the formation of the driving transistor 250, the first switching transistor 255, the sub-pixel structure 200, and the TFE structure 450. In a manufacturing the OLED display device 100, after the buffer layer 115 is formed on the second barrier layer 114, the driving transistor 250, the first switching transistor 255, the sub-pixel structure 200, and the TFE structure 450 may be formed on the buffer layer 115. After the driving transistor 250, the first switching transistor 255, the sub-pixel structure 200, and the TFE structure 450 are formed on the buffer layer 115, the rigid glass substrate on which the substrate 110 may be removed.

Formation of the driving transistor 250, the first switching transistor 255, the sub-pixel structure 200, and the TFE structure 450 on the substrate 110 may be difficult when the substrate 110 is relatively thin and flexible. Accordingly, the driving transistor 250, the first switching transistor 255, the sub-pixel structure 200, and the TFE structure 450 may be formed on the substrate 110 and the rigid glass substrate, and then the substrate 110 including the first organic film layer 111, the first barrier layer 112, the second organic film layer 113, and the second barrier layer 114 may serve as the substrate 110 of the OLED display device 100 after removal of the rigid glass substrate. Alternatively, the substrate 110 may include a quartz substrate, a synthetic quartz substrate, a calcium fluoride substrate, a fluoride-doped quartz substrate, a sodalime glass substrate, a non-alkali glass substrate etc.

In example embodiments, the substrate 110 includes four-layers. Alternatively, in some example embodiments, the substrate 110 may include a single layer or a plurality of layers.

The buffer layer 115 may be on the substrate 110. In example embodiments, the buffer layer 115 may fill the first trench 305, and may be on an entirety of the second barrier layer 114. The buffer layer 115 may have a substantially uniform thickness along the third direction D3 along a profile of the second barrier layer 114 on the second barrier layer 114. For example, the buffer layer 115 may include organic materials or inorganic materials. In example embodiments, the buffer layer 115 may include inorganic materials.

The buffer layer 115 may prevent the diffusion of metal atoms and/or impurities from the substrate 110 into the driving transistor 250, the first switching transistor 255, and the sub-pixel structure 200. In addition, the buffer layer 115 may control a rate of a heat transfer in a crystallization process for forming the first active layer 130 and the second active layer 135, thereby obtaining substantially uniform active layers. Further, the buffer layer 115 may improve a surface flatness of the substrate 110 when a surface of the substrate 110 is relatively irregular. According to a type of the substrate 110, at least two buffer layers may be provided on the substrate 110 or the buffer layer may not be present.

The first active layer 130 and the second active layer 135 may be on the buffer layer 115. The first active layer 130 and the second active layer 135 may be spaced apart from each other along the first direction D1. The first active layer 130 and the second active layer 135 may have a same thickness along the third direction D3. In example embodiments, the first active layer 130 may be inside the trench 305, and the second active layer 135 may be outside the trench 305. The first active layer 130 and the second active layer 135 may be on a same layer (e.g., on the buffer layer 115), but the first active layer 130 may be in a relatively lower level along the third direction D3 than the second active layer 135 due to the first trench 305.

Each of the first and second active layers 130 and 135 may include an oxide semiconductor, an inorganic semiconductor (e.g., amorphous silicon, polysilicon, etc.), an organic semiconductor, etc. For example, the first active layer 130 and the second active layer 135 may be simultaneously formed using same materials.

The gate insulation layer 150 may be on the first and second active layers 130 and 135, and the buffer layer 115. The gate insulation layer 150 may cover the first and second active layers 130 and 135 on the buffer layer 115, and may be on an entirety of the buffer layer 115. For example, the gate insulation layer 150 may cover the first and second active layers 130 and 135 on the buffer layer 115, and may have a substantially uniform thickness along the third direction D3 along a profile of the first and second active layers 130 and 135. Alternatively, the gate insulation layer 150 may sufficiently cover the first and second active layers 130 and 135 on the buffer layer 115, to have a substantially flat upper surface without a step around the first and second active layers 130 and 135. The gate insulation layer 150 may include, e.g., a silicon compound, a metal oxide, etc.

The first gate electrode 170 and the second gate electrode 175 may be on the gate insulation layer 150, and may be spaced apart from each other along the first direction D1. In example embodiments, the first gate electrode 170 may be inside the trench 305, and the second gate electrode 175 may be outside the trench 305. In other words, the first gate electrode 170 may be on a portion of the gate insulation layer 150 over the first active layer 130, and the second gate electrode 175 may be on a portion of the gate insulation layer 150 over the second active layer 135. The first gate electrode 170 and the second gate electrode 175 may be on a same layer (e.g., on the gate insulation layer 150), but the first gate electrode 170 may be at a relatively lower level along the third direction D3 than the second gate electrode 175 due to the first trench 305.

Each of the first and second gate electrodes 170 and 175 may include a metal, a metal alloy, metal nitride, conductive metal oxide, transparent conductive materials, etc. For example, each of the first and second gate electrodes 170 and 175 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chrome (Cr), tantalum (Ta), molybdenum (Mo), scandium (Sc), neodymium (Nd), iridium (Ir), an alloy of aluminum, aluminum nitride (AlNx), an alloy of silver, tungsten nitride (WNx), an alloy of copper, an alloy of molybdenum, titanium nitride (TiNx), chrome nitride (CrNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. These may be used alone or in a suitable combination thereof. Alternatively, each of the first and second gate electrodes 170 and 175 may have a multi-layered structure including a plurality of layers. For example, the first gate electrode 170 and the second gate electrode 175 may be simultaneously formed using same materials.

The insulating interlayer 190 may be on the first and second gate electrodes 170 and 175, and the gate insulation layer 150. The insulating interlayer 190 may cover the first and second gate electrodes 170 and 175 on the gate insulation layer 150, and may be on an entirety of the gate insulation layer 150. For example, the insulating interlayer 190 may cover the first and second gate electrodes 170 and 175 on the gate insulation layer 150, and may have a substantially uniform thickness along the third direction D3 along a profile of the first and second gate electrodes 170 and 175. Alternatively, the insulating interlayer 190 may sufficiently cover the first and second gate electrodes 170 and 175 on the gate insulation layer 150, to have a substantially flat upper surface without a step around the first and second gate electrodes 170 and 175. The insulating interlayer 190 may include silicon compound, metal oxide, etc.

The first source electrode 210, the first drain electrode 230, the second source electrode 215, and the second drain electrode 235 may be on the insulating interlayer 190. In example embodiments, the first source electrode 210 and the first drain electrode 230 may be inside the trench 305, and the second source electrode 215 and the second drain electrode 235 may be outside the trench 305. The first source electrode 210 may be in contact with a source region of the first active layer 130 via a contact hole in a first portion of the gate insulation layer 150 and the insulating interlayer 190. The first drain electrode 230 may be in contact with a drain region of the first active layer 130 via a contact hole in a second portion of the gate insulation layer 150 and the insulating interlayer 190. In addition, the second source electrode 215 may be in contact with a source region of the second active layer 135 via a contact hole in a third portion of the gate insulation layer 150 and the insulating interlayer 190, and the second drain electrode 235 may be in contact with a drain region of the second active layer 135 via a contact hole in fourth portion of the gate insulation layer 150 and the insulating interlayer 190. The first and second source electrodes 210 and 215 and the first and second drain electrodes 230 and 235 may be on a same layer (e.g., on the insulating interlayer 190), but the first and second source electrodes 210 and 215 may be at a relatively lower level along the third direction D3 than the first and second drain electrodes 230 and 235 due to the first trench 305.

Each of the first and second source electrodes 210 and 215 and the first and second drain electrodes 230 and 235 may include a metal, an alloy, metal nitride, conductive metal oxide, transparent conductive materials, etc. These may be used alone or in a suitable combination thereof. Alternatively, each of the first and second source electrodes 210 and 215 and the first and second drain electrodes 230 and 235 may have a multi-layered structure including a plurality of layers. For example, the first and second source electrodes 210 and 215 and the first and second drain electrodes 230 and 235 may be simultaneously formed using same materials. Accordingly, the driving transistor 250 including the first active layer 130, the first gate electrode 170, the first source electrode 210, and the first drain electrode 230 may be constituted, and the first switching transistor 255 including the second active layer 135, the second gate electrode 175, the second source electrode 215, and the second drain electrode 235 may be constituted.

In example embodiments, the driving transistor 250 may be inside the first trench 305 and, along the first direction, a width of the first trench 305 may be greater than a width of the driving transistor 250. In other words, the first trench 305 may overlap, e.g., completely overlap, the driving transistor 250 along the third direction D3 such that the driving transistor 250 is fully in the first trench. In addition, the driving transistor 250 may be at a lower level along the third direction D3 than the first switching transistor 255. For example, along the third direction D3, a height from an upper surface of the substrate 110 to an upper surface of the driving transistor 250 (e.g., an upper surface of the first source electrode 210 or an upper surface of the first drain electrode 230) may be less than a height from an upper surface of the substrate 110 to an upper surface of the first switching transistor 255 (e.g., an upper surface of the second source electrode 215 or an upper surface of the second drain electrode 235). Further, only the first organic film layer 111 may be under the driving transistor 250, while both the first organic film layer 111 and the second organic film layer 113 may be under the first switching transistor 255.

When the substrate 110 of the OLED display device 100 is a flexible substrate including a polyimide-based resin, the flexible substrate may have a relatively more electric charges than a glass substrate. When the OLED display device 100 is driven, an electric field between wirings included in the OLED display device 100 may be generated (e.g., the electric field is generated by a difference of a voltage level applied to a scan signal wiring and a voltage level applied to an emission signal wiring), such that the electric charges may be non-uniformly distributed under transistors by the electric field, such that the electric charges may interfere with driving the transistors. In other words, a threshold voltage of the transistors may be changed because of a non-uniform distribution of the electric charges, and a luminance of the sub-pixel structure 200 may be changed because of the changed amount of current. That is, reliability and lifetime of the transistors may be reduced. For example, when a relatively amount of current is continuously applied to the transistors because of the changed amount of current, the lifetime of the transistors may be relatively reduced.

The driving transistor 250 among the transistors may control a driving current according to a data signal, and the sub-pixel structure 200 may emit light according to the driving current. In other words, the driving transistor 250 may have a relatively greater effect on an emission of the sub-pixel structure 200 than the first switching transistor 255. That is, when a threshold voltage of the driving transistor 250 is changed due to the non-uniformly distributed electric charges, a luminance change of the OLED display device 100 may be relatively greater than when a threshold voltage of the first switching transistor 255 is changed due to the non-uniformly distributed electric charges.

In example embodiments, when the second organic film layer 113 is removed under the driving transistor 250 (or the first opening 101 of the second organic film layer 113 is formed under the driving transistor 250), an effect of the non-uniformly distributed electric charges on the driving transistor 250 may be reduced or prevented.

In example embodiments, the OLED display device 100 includes two transistors (e.g., the driving transistor 250 and the first switching transistor 255). Alternatively, the OLED display device 100 may include at least three transistors and at least one capacitor. In addition, each of the driving transistor 250 and the first switching transistor 255 has a top gate structure. Alternatively, each of the driving transistor 250 and the first switching transistor 255 may have a bottom gate structure or a double gate structure.

In example embodiments, the first barrier layer 112 and the second barrier layer 114 are under the driving transistor 250. Alternatively, the first barrier layer 112, the second barrier layer 114, or neither may be under the driving transistor 250.

The planarization layer 270 may be on the insulating interlayer 190, the first and second source electrodes 210 and 215, and the first and second drain electrodes 230 and 235. A contact hole 275 exposing a portion of the second drain electrode 235 of the first switching transistor 255 may be formed in the planarization layer 270. The planarization layer 270 may have a thickness sufficient to cover the first and second source electrodes 210 and 215, and the first and second drain electrodes 230 and 235 on the insulating interlayer 190. In this case, the planarization layer 270 may have a substantially flat upper surface, and a planarization process may be further performed on the planarization layer 270 to realize a flat upper surface. The planarization layer 270 may include organic materials or inorganic materials. In example embodiments, the planarization layer 270 may include organic materials.

The lower electrode 290 may be on the planarization layer 270. The lower electrode 290 may be in direct contact with the second drain electrode 235 via the contact hole 275 of the planarization layer 270 to be electrically connected to the first switching transistor 255. The lower electrode 290 may include a metal, a metal alloy, metal nitride, conductive metal oxide, transparent conductive materials, etc., either alone or in a suitable combination thereof. Alternatively, the lower electrode 290 may have a multi-layered structure including a plurality of layers.

The pixel defining layer 310 may be on a portion of the lower electrode 290 and the planarization layer 270. The pixel defining layer 310 may cover both lateral portions of the lower electrode 290, and may have an opening 315 exposing a portion of an upper surface of the lower electrode 290. The pixel defining layer 310 may include organic materials or inorganic materials. In example embodiments, the pixel defining layer 310 may include organic materials.

The light emitting layer 330 may be on the lower electrode 290 exposed by the pixel defining layer 310. The light emitting layer 330 may be formed using at least one of light emitting materials capable of generating different colors of light (e.g., red light, blue light, green light, etc.) according to sub-pixels. Alternatively, the light emitting layer 330 may generate white light by stacking a plurality of light emitting materials capable of generating different colors of light, e.g., red light, green light, blue light, etc. In this case, a color filter may be on the light emitting layer 330 (e.g., to overlap the light emitting layer 330 on an upper surface of the TFE structure 450) along the third direction D3. The color filter may include at least one selected from a red color filter, a green color filter, and a blue color filter. Alternatively, the color filter may include a yellow color filter, a cyan color filter, and a magenta color filter. The color filter may include a photosensitive resin, etc.

The upper electrode 340 may be on the pixel defining layer 310 and the light emitting layer 330. The upper electrode 340 may cover the light emitting layer 330 and the pixel defining layer 310, and may be on the entire substrate 110. The upper electrode 340 may include a metal, a metal alloy, metal nitride, conductive metal oxide, transparent conductive materials, etc., alone or in a suitable combination thereof. Alternatively, the upper electrode 340 may have a multi-layered structure including a plurality of layers. Accordingly, the sub-pixel structure 200 may include the lower electrode 290, the light emitting layer 330, and the upper electrode 340.

The first TFE layer 451 may be on the upper electrode 340. The first TFE layer 451 may cover the upper electrode 340, and may have a substantially uniform thickness along the third direction D3 along a profile of the upper electrode 340. The first TFE layer 451 may prevent the sub-pixel structure 200 from being deteriorated by the permeation of contaminants, e.g., moisture, water, oxygen, etc. In addition, the first TFE layer 451 may protect the sub-pixel structure 200 from external impacts. The first TFE layer 451 may include inorganic materials having flexibility.

The second TFE layer 452 may be on the first TFE layer 451. The second TFE layer 452 may improve the flatness of the OLED display device 100, and may protect the sub-pixel structure 200. The second TFE layer 452 may include organic materials having flexibility.

The third TFE layer 453 may be on the second TFE layer 452. The third TFE layer 453 may cover the second TFE layer 452, and may have a substantially uniform thickness along the third direction D3 along a profile of the second TFE layer 452. The third TFE layer 453 together with the first TFE layer 451 and the second TFE layer 452 may prevent the sub-pixel structure 200 from being deteriorated by the permeation of contaminants, e.g., moisture, water, oxygen, etc. In addition, the third TFE layer 453 together with the first TFE layer 451 and the second TFE layer 452 may protect the sub-pixel structure 200 from external impacts. The third TFE layer 453 may include inorganic materials having flexibility. Accordingly, the TFE structure 450 may include the first TFE layer 451, the second TFE layer 452, and the third TFE layer 453. Alternatively, the TFE structure 450 may have five layers structure where first through fifth TFE layers are stacked, a seven layer structure where the first through seventh TFE layers are stacked, and so forth.

In some example embodiments, an encapsulation substrate that substitutes for the TFE structure 450 may be on the upper electrode 340. The encapsulation substrate may include a quartz substrate, a synthetic quartz substrate, a calcium fluoride substrate, a fluoride-doped quartz substrate, a sodalime glass substrate, a non-alkali glass substrate, etc.

As the OLED display device 100 in accordance with example embodiments includes the first opening 101 of the second organic film layer 113 under the driving transistor 250, the driving transistor 250 may receive a relatively small effect on the non-uniformly distributed electric charges. Accordingly, reliability and lifetime of the driving transistor 250 included in the OLED display device 100 may be improved.

Figure 4:
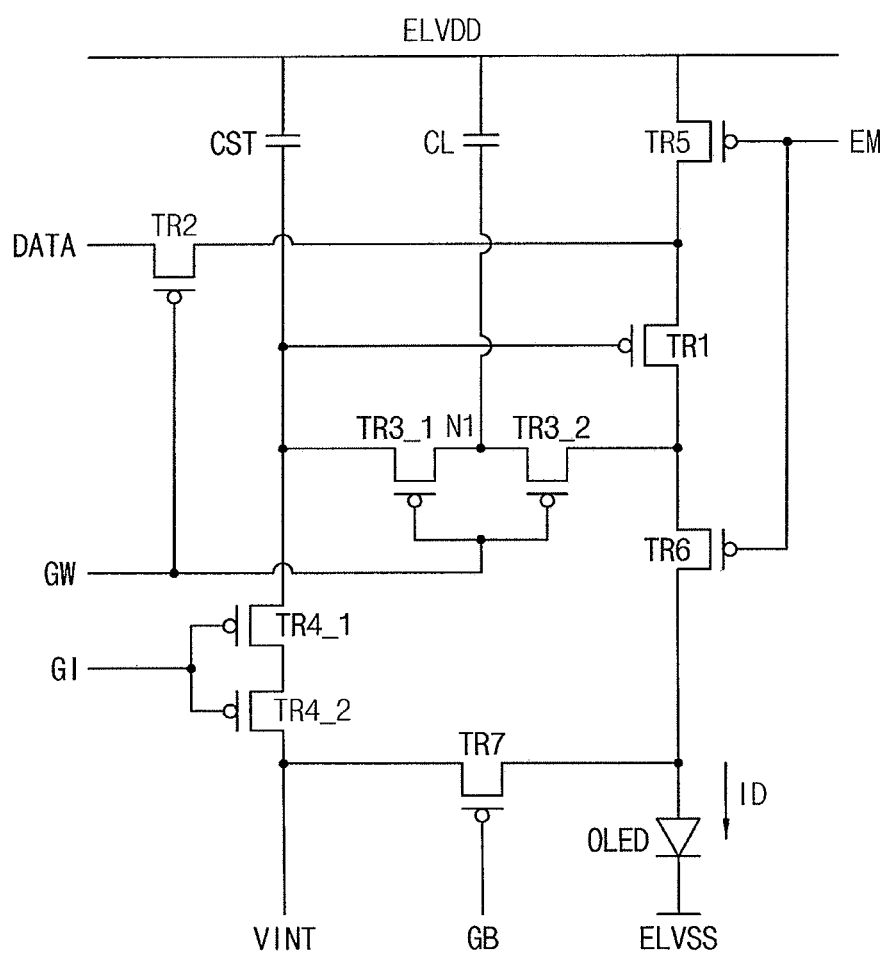
FIG. 4 illustrates a circuit diagram for describing an OLED and transistors included in the OLED display device of FIG. 3.

FIG. 4 is a circuit diagram for describing an OLED and transistors included in the OLED display device of FIG. 3. For example, the OLED display device 100 may include a plurality of sub-pixels, and each of the sub-pixels may correspond to a circuit illustrated in FIG. 4. Referring to FIG. 4, the OLED display device 100 may include an OLED (e.g., the sub-pixel structure 200 of FIG. 3), transistors (e.g., the driving transistor 250 and the first switching transistor 255 of FIG. 3), capacitors, etc.

The OLED may emit light based on a driving current ID. The OLED may include a first terminal and a second terminal. In example embodiments, the second terminal of the OLED receives a first power voltage ELVSS. For example, the first terminal of the OLED is an anode terminal and the second terminal of the OLED is a cathode terminal. Alternatively, the first terminal of the OLED may be a cathode terminal, and the second terminal of the OLED may be an anode terminal. In example embodiments, the anode terminal of the OLED may correspond to the lower electrode 290 of FIG. 3 and the cathode terminal of the OLED may correspond to the upper electrode 340 of FIG. 3.

A first transistor TR1 may include a gate terminal, a first terminal, and a second terminal. In example embodiments, the first terminal of the first transistor TR1 is a source terminal, and the second terminal of the first transistor TR1 is a drain terminal. Alternatively, the first terminal of the first transistor TR1 may be a drain terminal, and the second terminal of the first transistor TR1 may be a source terminal.

The driving current ID may be generated by the first transistor TR1. In example embodiments, the first transistor TR1 operates in a saturation region. In this case, the first transistor TR1 may generate the driving current ID based on a voltage difference of the gate terminal and the source terminal, and a gradation may be implemented based on the amount of the driving current ID generated by the first transistor TR1. Alternatively, the first transistor TR1 operates in a linear region. In this case, a gradation may be implemented based on the amount of time during which the first transistor TR1 provides the driving current ID to the OLED within one frame. In example embodiments, the first transistor TR1 may correspond to the driving transistor 250 inside the first trench 305 of FIG. 3.

A second transistor TR2 may include a gate terminal, a first terminal, and a second terminal. A scan signal GW may be applied to the gate terminal of the second transistor TR2. The first terminal of the second transistor TR2 may receive a data signal DATA. The second terminal of the second transistor TR2 may be connected to the first terminal of the first transistor TR1. In example embodiments, the first terminal of the second transistor TR2 is a source terminal and the second terminal of the second transistor TR2 is a drain terminal. Alternatively, the first terminal of the second transistor TR2 may be a drain terminal and the second terminal of the second transistor TR2 may be a source terminal.

The second transistor TR2 may provide the data signal DATA to the first terminal of the first transistor TR1 while the scan signal GW is activated. In this case, the second transistor TR2 operates in a linear region.

Third transistors TR3_1 and TR3_2 may include a gate terminal, a first terminal, and a second terminal. Here, the third transistor TR3_1 and the third transistor TR3_2 may be connected in series, and may serve as a dual transistor. For example, when the dual transistor is turned-off, a leakage current may be decreased. The gate terminals of the third transistors TR3_1 and TR3_2 may receive a scan signal GW. The first terminal of the third transistors TR3_1 and TR3_2 may be connected to the gate terminal of the first transistor TR1. The second terminal of the third transistors TR3_1 and TR3_2 may be connected to the second terminal of the first transistor TR1. In example embodiments, the first terminal of the third transistors TR3_1 and TR3_2 is a source terminal, and the second terminal of the third transistors TR3_1 and TR3_2 is a drain terminal. Alternatively, the first terminal of the third transistors TR3_1 and TR3_2 may be a drain terminal, and the second terminal of the third transistors TR3_1 and TR3_2 may be a source terminal.

The third transistors TR3_1 and TR3_2 may connect the gate terminal of the first transistor TR1 to the second terminal of the first transistor TR1 while the scan signal GW is activated. In this case, the third transistors TR3_1 and TR3_2 may operate in a linear region. That is, the third transistors TR3_1 and TR3_2 may form a diode connection of the first transistor TR1 while the scan signal GW is activated. A voltage difference between the first terminal of the first transistor TR1 and the gate terminal of the first transistor TR1, the voltage difference that corresponds to a threshold voltage of the first transistor TR1, may occur due to the diode connection. As a result, a sum voltage of the data signal DATA provided to the first terminal of the first transistor TR1 and the voltage difference (i.e., the threshold voltage) may be applied to the gate terminal of the first transistor TR1 while the scan signal GW is activated. Thus, the data signal DATA may be compensated as much as the threshold voltage of the first transistor TR1. The compensated data signal DATA may be applied to the gate terminal of the first transistor TR1. A uniformity of the driving current ID may be improved because of reducing an affect by the threshold voltage of the first transistor TR1.

A first node N1 is between the third transistor TR3_1 and the third transistor TR3_2. The OLED display device 100 may include the capacitor CL connected to the first node N1 and a second power supply voltage ELVDD wiring. In this case, although a voltage level of the data signal DATA is changed, crosstalk in the first node N1 that is adjacent to a data signal DATA wiring may be reduced.

An input terminal of an initialization voltage VINT is connected to a first terminal of fourth transistors TR4_1 and TR4_2 and a first terminal of a seventh transistor TR7, and an output terminal of an initialization voltage VINT is connected to a second terminal of the fourth transistors TR4_1 and TR4_2 and a first terminal of a storage capacitor CST.

The fourth transistors TR4_1 and TR4_2 may include a gate terminal, the first terminal, and the second terminal. Here, the fourth transistor TR4_1 and the fourth transistor TR4_2 may be connected in series, and may serve as a dual transistor. For example, when the dual transistor is turned-off, a leakage current may be decreased. The gate terminal of the fourth transistors TR4_1 and TR4_2 may receive a data initialization signal GI. The initialization voltage VINT may be applied to the first terminal of the fourth transistors TR4_1 and TR4_2. The second terminal of the fourth transistors TR4_1 and TR4_2 may be connected to the gate terminal of the first transistor TR1. In example embodiments, the first terminal of the fourth transistors TR4_1 and TR4_2 is a source terminal, and the second terminal of the fourth transistors TR4_1 and TR4_2 is a drain terminal. Alternatively, the first terminal of the fourth transistors TR4_1 and TR4_2 may be a drain terminal and the second terminal of the fourth transistors TR4_1 and TR4_2 may be a source terminal.

The fourth transistors TR4_1 and TR4_2 may apply the initialization voltage VINT to the gate terminal of the first transistor TR1 while the data initialization signal GI is activated. In this case, the fourth transistors TR4_1 and TR4_2 may operate in the linear region. Thus, the fourth transistor TR4_1 and TR4_2 may initialize the gate terminal of the first transistor TR1 as the initialization voltage VINT while the data initialization signal GI is activated. In example embodiments, a voltage level of the initialization voltage VINT is sufficiently lower than a voltage level of the data signal DATA maintained by the storage capacitor CST in a previous frame. The initialization voltage VINT may be applied to the gate terminal of the first transistor TR1 that is a P-channel metal oxide semiconductor (PMOS) type transistor. In some example embodiments, a voltage level of the initialization voltage VINT is sufficiently higher than the voltage level of the data signal DATA maintained by the storage capacitor CST in a previous frame. The initialization voltage VINT may be applied to the gate terminal of the first transistor TR1 that is an N-channel metal oxide semiconductor (NMOS) type transistor.

In example embodiments, the data initialization signal GI is identical to the scan signal GW advanced by one horizontal time period. For example, the data initialization signal GI is applied to sub-pixels located in a (n)th row among a plurality of sub-pixels included in the OLED display device 100 (where n is an integer of 2 or more) is substantially a same as the scan signal GW applied to sub-pixels located in a (n−1)th row among a plurality of the sub-pixels. This is, the data initialization signal GI that is activated may be applied to the sub-pixels located in the (n)th row among the sub-pixels by applying the scan signal GW that is activated to the sub-pixels located in the (n−1)th row among the sub-pixels. As a result, the gate terminal of the first transistor TR1 included in the sub-pixels located in the (n)th row among the sub-pixels may be initialized as the initialization voltage VINT when the data signal DATA is applied to sub-pixels located in the (n−1)th row among the sub-pixels.

A fifth transistor TR5 may apply a second power voltage ELVDD to the first terminal of the first transistor TR1 while an emission signal EM is activated. On the other hands, the fifth transistor TR5 does not apply the second power voltage ELVDD while the emission signal EM is inactivated. In this case, the fifth transistor TR5 may operate in the linear region. The fifth transistor TR5 may apply the second power voltage ELVDD to the first terminal of the first transistor TR1 while the emission signal EM is activated such that the first transistor TR1 generates the driving current ID. In addition, the fifth transistor TR5 does not apply the second power voltage ELVDD while the emission signal EM is inactivated such that the data signal DATA applied to the first terminal of the first transistor TR1 is applied to the gate terminal of the first transistor TR1.

A sixth transistor TR6 may include a gate terminal, a first terminal, and a second terminal. The emission signal EM may be applied to the gate terminal of the sixth transistor TR6. The first terminal of the sixth transistor TR6 may be connected to the second terminal of the first transistor TR1. The second terminal of the sixth transistor TR6 may be connected to the first terminal of the OLED. In example embodiments, the first terminal of the sixth transistor TR6 is a source terminal and the second terminal of the sixth transistor TR6 is a drain terminal. Alternatively, the first terminal of the sixth transistor TR6 may be a drain terminal and the second terminal of the sixth transistor TR6 may be a source terminal.

The sixth transistor TR6 may provide the driving current ID generated by the first transistor TR1 to the OLED while the emission signal EM is activated. In this case, the sixth transistor TR6 may operate in the linear region. That is, the sixth transistor TR6 may provide the driving current ID generated by the first transistor TR1 to the OLED while the emission signal EM is activated such that the OLED emits light. In addition, the sixth transistor TR6 may disconnect the first transistor TR1 from the OLED while the emission signal EM is inactivated such that the compensated data signal DATA applied to the second terminal of the first transistor TR1 is applied to the gate terminal of the first transistor TR1.

The seventh transistor TR7 may include a gate terminal, a first terminal, and a second terminal. A diode initialization signal GB (e.g., the data initialization signal GI) may be applied to the gate terminal of the seventh transistor TR7. The initialization voltage VINT may be applied to the first terminal of the seventh transistor TR7. The second terminal of the seventh transistor TR7 may be connected to the first terminal of the OLED. In example embodiments, the first terminal of the seventh transistor TR7 is a source terminal and the second terminal of the seventh transistor TR7 is a drain terminal. Alternatively, the first terminal of the seventh transistor TR7 may be a drain terminal and the second terminal of the seventh transistor TR7 may be a source terminal.

The seventh transistor TR7 may apply the initialization voltage VINT to the first terminal of the OLED while the diode initialization signal GB is activated. In this case, the seventh transistor TR7 may operate in the linear region. That is, the seventh transistor TR7 may initialize the first terminal of the OLED as the initialization voltage VINT while the diode initialization signal GB is activated. In example embodiments, the seventh transistor TR7 may correspond to the first switching transistor 255 illustrated in FIG. 3.

Alternatively, the data initialization signal GI and the diode initialization signal GB are a substantially same signal. An initialization operation of the gate terminal of the first transistor TR1 may do not affect an initialization operation of the first terminal of the OLED. That is, the initialization operation of the gate terminal of the first transistor TR1 and the initialization operation of the first terminal of the OLED may be independent to each other. Therefore, the data initialization signal GI is used as the diode initialization signal GB, thereby improving the manufacturing efficiency.

The storage capacitor CST may include the first terminal and the second terminal, and may be connected between a second power voltage ELVDD wiring and the gate terminal of the first transistor TR1. For example, the first terminal of the storage capacitor CST may be connected to the gate terminal of the first transistor TR1 and the second terminal of the storage capacitor CST may be connected to the second power supply voltage ELVDD wiring. The storage capacitor CST may maintain a voltage level of the gate terminal of the first transistor TR1 while the scan signal GW is inactivated. The emission signal EM may be activated while the scan signal GW is inactivated. The driving current ID generated by the first transistor TR1 may be provided to the OLED while the emission signal EM is activated. Therefore, the driving current ID generated by the first transistor TR1 may be provided to the OLED based on the voltage level maintained by the storage capacitor CST.

That is, in another cross-sectional view of FIG. 1, the second through sixth transistors TR2, TR3_1, TR3_2, TR4_1, TR4_2, TR5, and TR6, as well as the first and seventh transistors TR1 and TR7 may be illustrated in FIG. 3.

FIGS. 5 through 10 are cross-sectional views illustrating stages in a method of manufacturing an OLED display device in accordance with example embodiments.

Figure 5:
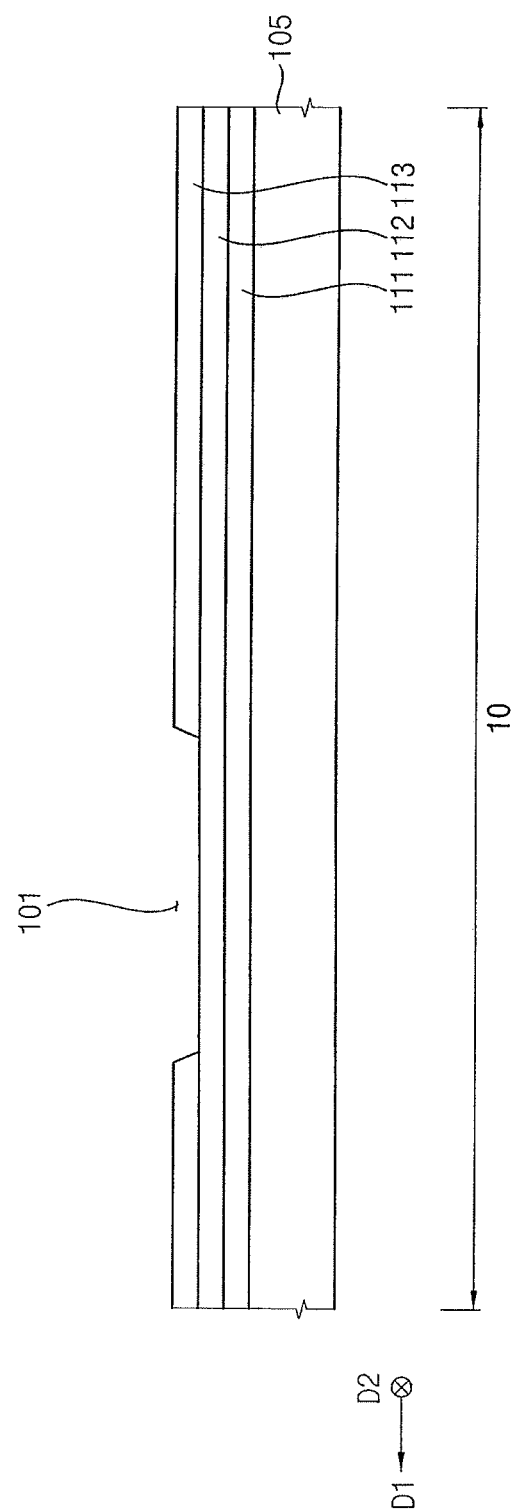
FIGS. 5 through 10 illustrate cross-sectional views of stages in a method of manufacturing an OLED display device in accordance with example embodiments.

Referring to FIG. 5, a rigid glass substrate 105 may be provided. The first organic film layer 111 may be formed on the entire rigid glass substrate 105, and a first barrier layer 112 may be formed on the entire first organic film layer 111. After the first barrier layer 112 is formed, a preliminary organic film layer may be formed on the first barrier layer 112. After the preliminary organic film layer is formed, the first opening 101 may be formed by selectively etching the preliminary organic film layer. The preliminary organic film layer having the first opening 101 may be defined as a second organic film layer 113.

Figure 6:
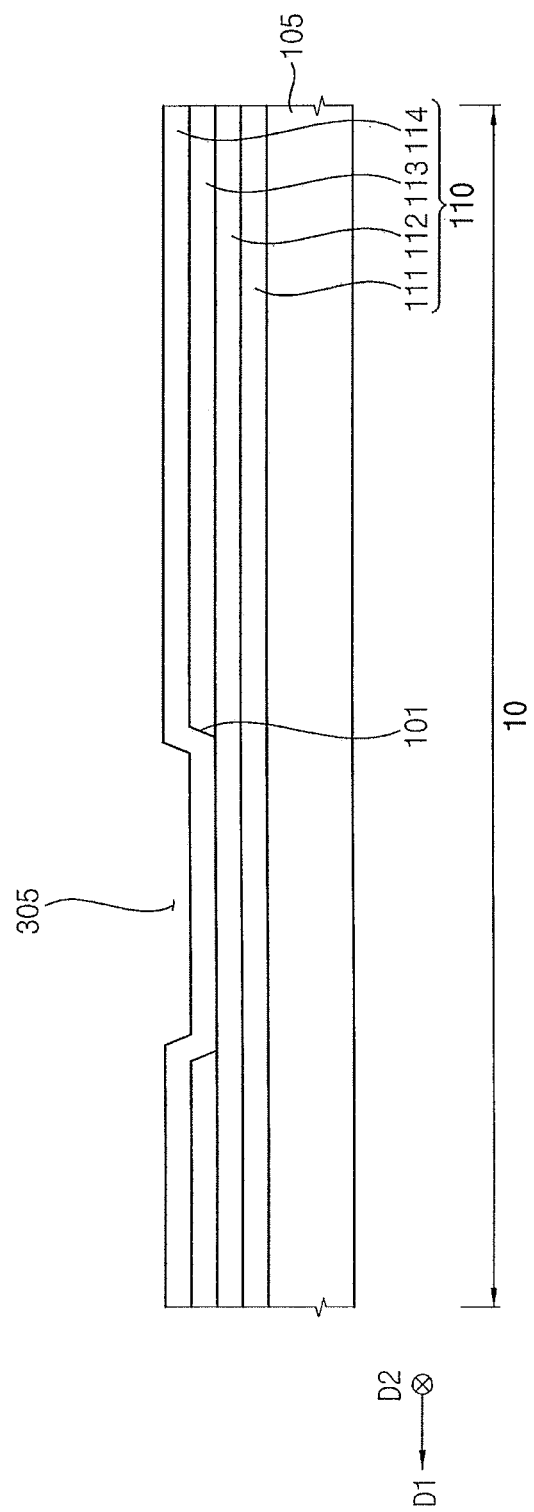

Referring to FIG. 6, the second barrier layer 114 may fill the first opening 101 of the second organic film layer 113 and may be formed on the entire second organic film layer 113. As the first organic film layer 111, the first barrier layer 112, the second organic film layer 113, and the second barrier layer 114 are sequentially formed along the third direction D3, on the rigid glass substrate 105, the substrate 110 may be formed. As the second organic film layer 113 has the first opening 101, the first trench 305 may be formed in the substrate 110.

Each of the first barrier layer 112 and the second barrier layer 114 may be formed using inorganic materials such as silicon compound, metal oxide, etc. For example, each of the first barrier layer 112 and the second barrier layer 114 may include, e.g., SiOx, SiNx, SiOxNy, SiOxCy, SiCxNy, AlOx, AlNx, TaOx, HfOx, ZrOx, TiOx, etc. In addition, each of the first organic film layer 111 and the second organic film layer 113 may be formed using polyimide, epoxy-based resin, acryl-based resin, polyester, photoresist, polyacryl-based resin, polyimide-based resin, a polyamide-based resin, a siloxane-based resin, etc. In example embodiments, the first and second barrier layers 112 and 114 each may include SiOx, and may block moisture or water that permeates through the first and second organic film layers 111 and 113. Further, the first and second organic film layers 111 and 113 each may include a polyamide-based resin such that an OLED display device has flexibility, and the polyimide-based resin may be random copolymer or block copolymer. The polyimide-based resin may have a high transparency, a low coefficient of thermal expansion, and a high glass transition temperature. Since the polyimide-based resin includes an imide radical, heat resistance, chemical resistance, durability, and an electrical characteristics may be excellent.

Alternatively, the substrate 110 may be formed using a quartz substrate, a synthetic quartz substrate, a calcium fluoride substrate, a fluoride-doped quartz substrate, a sodalime glass substrate, a non-alkali glass substrate etc.

Figure 7:
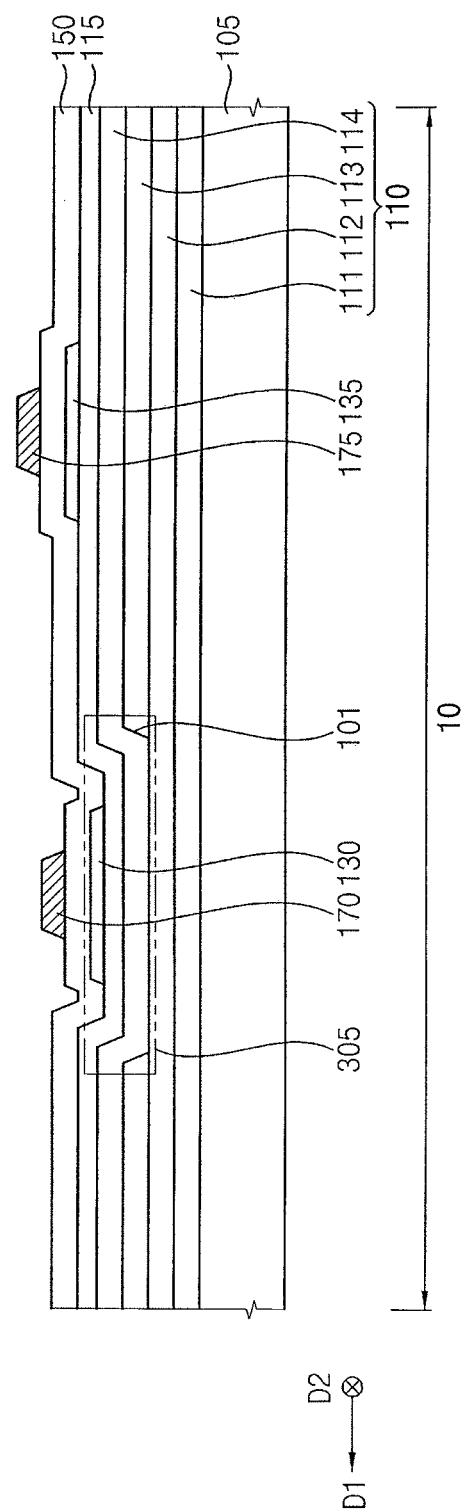

Referring to FIG. 7, the buffer layer 115 may be formed on the substrate 110. In example embodiments, the buffer layer 115 may fill the first trench 305 and may be formed on the entire second barrier layer 114. In other words, the buffer layer 115 may be formed as a substantially uniform thickness along a profile of the second barrier layer 114 on the second barrier layer 114. The buffer layer 115 may prevent the diffusion of metal atoms and/or impurities from the substrate 110. In addition, the buffer layer 115 may control a rate of a heat transfer in a crystallization process for forming active layers, thereby obtaining substantially uniform active layers. Further, the buffer layer 115 may improve a surface flatness of the substrate 110 when a surface of the substrate 110 is relatively irregular. According to a type of the substrate 110, at least two buffer layers may be provided on the substrate 110 or the buffer layer may not be provided. For example, the buffer layer 115 may include organic materials or inorganic materials. In example embodiments, the buffer layer 115 may be formed using inorganic materials.

The first active layer 130 and the second active layer 135 may be formed on the buffer layer 115. The first active layer 130 and the second active layer 135 may be spaced apart from each other. In example embodiments, the first active layer 130 may be inside the trench 305 and the second active layer 135 may be outside the trench 305. Each of the first and second active layers 130 and 135 may include an oxide semiconductor, an inorganic semiconductor, an organic semiconductor, etc. In example embodiments, the first active layer 130 and the second active layer 135 may be simultaneously (or concurrently) formed using same materials. For example, after a preliminary active layer is formed on the entire buffer layer 115, the first active layer 130 and the second active layer 135 may be simultaneously formed by selectively etching the preliminary active layer.

The gate insulation layer 150 may be formed on the first and second active layers 130 and 135, and the buffer layer 115. The gate insulation layer 150 may cover the first and second active layers 130 and 135 on the buffer layer 115, and may be formed on the entire buffer layer 115. For example, the gate insulation layer 150 may cover the first and second active layers 130 and 135 on the buffer layer 115, and may be formed as a substantially uniform thickness along a profile of the first and second active layers 130 and 135. Alternatively, the gate insulation layer 150 may sufficiently cover the first and second active layers 130 and 135 on the buffer layer 115 to have a substantially flat upper surface without a step around the first and second active layers 130 and 135. The gate insulation layer 150 may be formed using silicon compound, metal oxide, etc.

A first gate electrode 170 and a second gate electrode 175 may be formed on the gate insulation layer 150, and may be spaced apart from each other. In example embodiments, the first gate electrode 170 may be inside the trench 305, and the second gate electrode 175 may be outside the trench 305. In other words, the first gate electrode 170 may be formed on a portion of the gate insulation layer 150 under the first active layer 130, and the second gate electrode 175 may be formed on a portion of the gate insulation layer 150 under the second active layer 135.

Each of the first and second gate electrodes 170 and 175 may be formed using a metal, a metal alloy, metal nitride, conductive metal oxide, transparent conductive materials, etc. For example, each of the first and second gate electrodes 170 and 175 may include Au, Ag, Al, W, Cu, Pt, Ni, Ti, Pd, Mg, Ca, Li, Cr, Ta, Mo, Sc, Nd, Ir, an alloy of aluminum, AlNx, an alloy of silver, WNx, an alloy of copper, an alloy of molybdenum, TiNx, CrNx, TaNx, SRO, ZnOx, ITO, SnOx, InOx, GaOx, IZO, etc. These may be used alone or in a suitable combination thereof. Alternatively, each of the first and second gate electrodes 170 and 175 may have a multi-layered structure including a plurality of layers. In example embodiments, the first gate electrode 170 and the second gate electrode 175 may be simultaneously formed using same materials. For example, after a preliminary first electrode layer is formed on the entire gate insulation layer 150, the first gate electrode 170 and the second gate electrode 175 may be simultaneously formed by selectively etching the preliminary first electrode layer.

Figure 8:
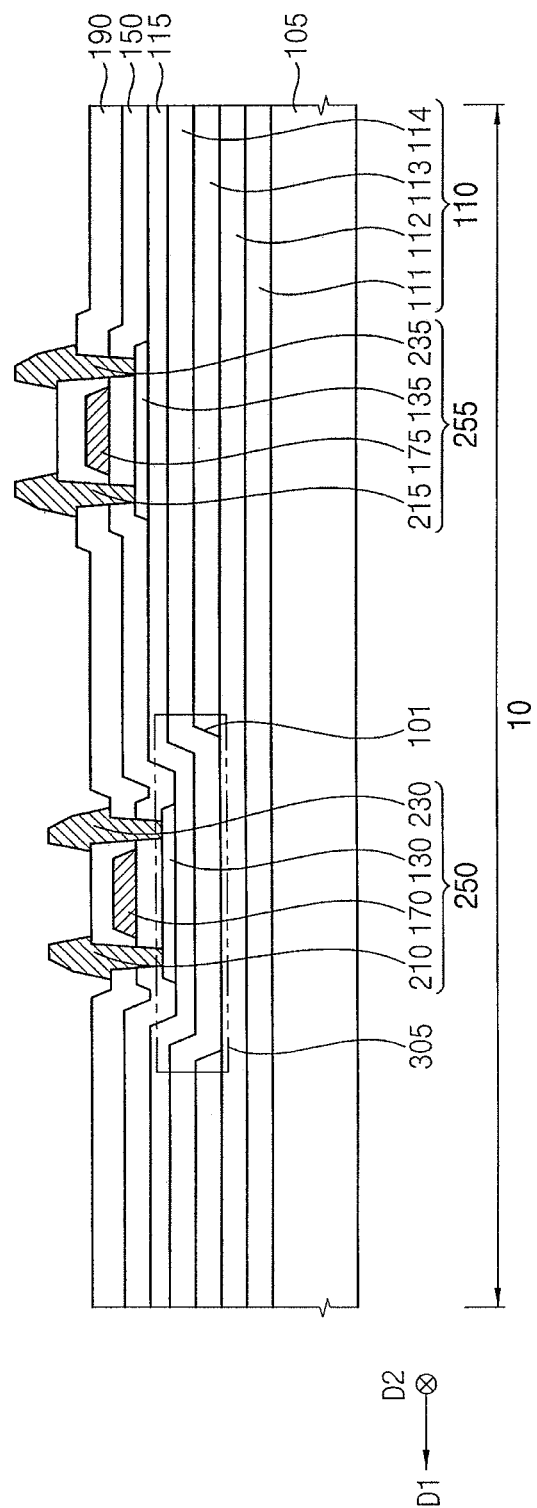

Referring to FIG. 8, the insulating interlayer 190 may be formed on the first and second gate electrodes 170 and 175 and the gate insulation layer 150. The insulating interlayer 190 may cover the first and second gate electrodes 170 and 175 on the gate insulation layer 150, and may be formed on the entire gate insulation layer 150. For example, the insulating interlayer 190 may cover the first and second gate electrodes 170 and 175 on the gate insulation layer 150, and may have a substantially uniform thickness along a profile of the first and second gate electrodes 170 and 175. Alternatively, the insulating interlayer 190 may sufficiently cover the first and second gate electrodes 170 and 175 on the gate insulation layer 150 to have a substantially flat upper surface without a step around the first and second gate electrodes 170 and 175. The insulating interlayer 190 may be formed using silicon compound, metal oxide, etc.

The first source electrode 210, the first drain electrode 230, the second source electrode 215, and the second drain electrode 235 may be formed on the insulating interlayer 190. In example embodiments, the first source electrode 210 and the first drain electrode 230 may be formed inside the trench 305, and the second source electrode 215 and the second drain electrode 235 may be formed outside the trench 305. The first source electrode 210 may be in contact with a source region of the first active layer 130 via a contact hole formed by removing a first portion of the gate insulation layer 150 and the insulating interlayer 190, and the first drain electrode 230 may be in contact with a drain region of the first active layer 130 via a contact hole formed by removing a second portion of the gate insulation layer 150 and the insulating interlayer 190. In addition, the second source electrode 215 may be in contact with a source region of the second active layer 135 via a contact hole formed by removing a third portion of the gate insulation layer 150 and the insulating interlayer 190, and the second drain electrode 235 may be in contact with a drain region of the second active layer 135 via a contact hole formed by removing a fourth portion of the gate insulation layer 150 and the insulating interlayer 190.

Each of the first and second source electrodes 210 and 215 and the first and second drain electrodes 230 and 235 may be formed using a metal, an alloy, metal nitride, conductive metal oxide, transparent conductive materials, etc. These may be used alone or in a suitable combination thereof. Alternatively, each of the first and second source electrodes 210 and 215 and the first and second drain electrodes 230 and 235 may have a multi-layered structure including a plurality of layers. In example embodiments, the first and second source electrodes 210 and 215 and the first and second drain electrodes 230 and 235 may be simultaneously formed using same materials. For example, after a preliminary second electrode layer is formed on the entire insulating interlayer 190, the first and second source electrodes 210 and 215 and the first and second drain electrodes 230 and 235 may be simultaneously formed by selectively etching the preliminary second electrode layer.

Accordingly, the driving transistor 250 including the first active layer 130, the first gate electrode 170, the first source electrode 210, and the first drain electrode 230 may be formed, and the first switching transistor 255 including the second active layer 135, the second gate electrode 175, the second source electrode 215, and the second drain electrode 235 may be formed.

Figure 9:
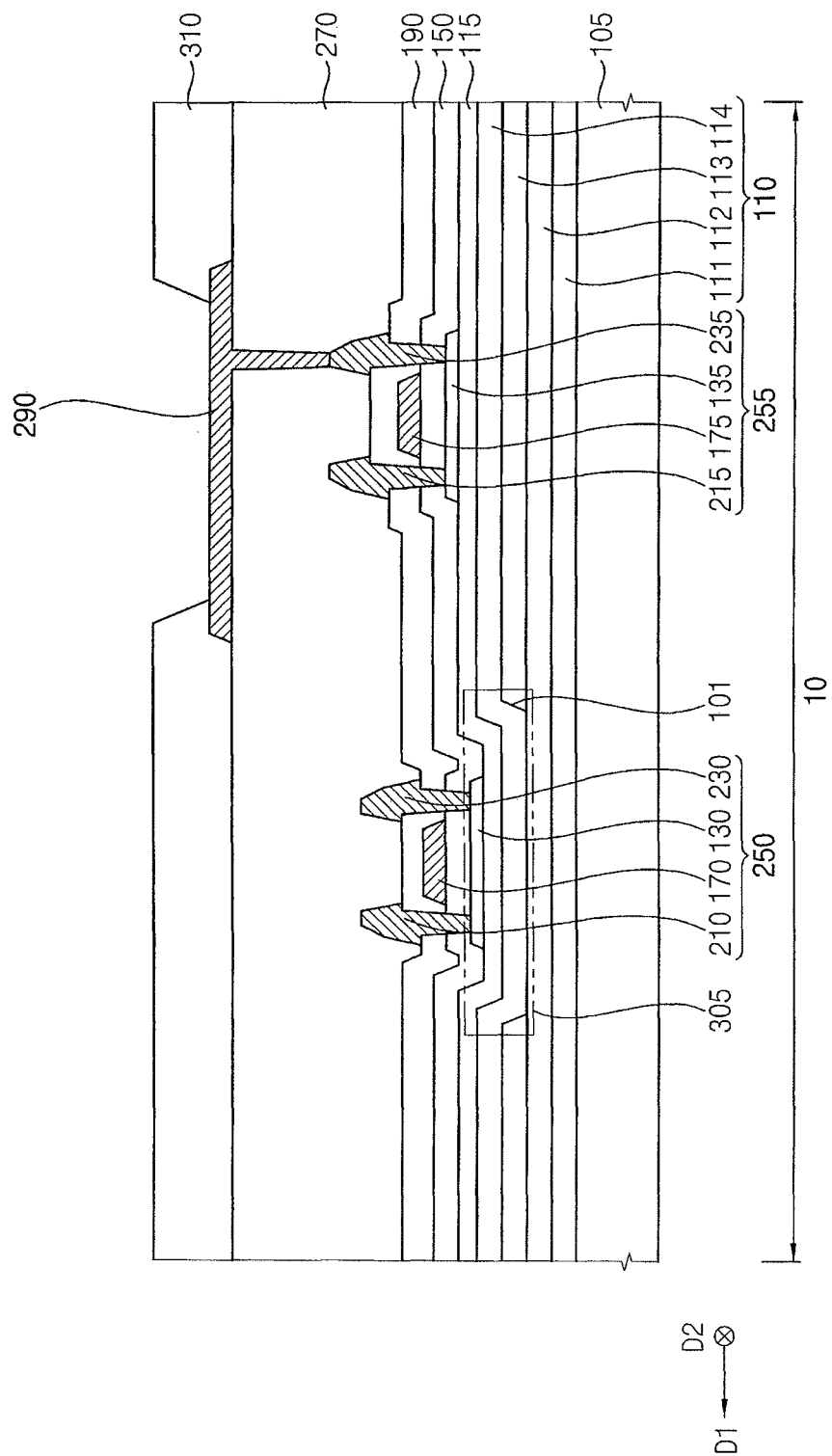

Referring to FIG. 9, the planarization layer 270 may be formed on the insulating interlayer 190, the first and second source electrodes 210 and 215, and the first and second drain electrodes 230 and 235, and a contact hole exposing a portion of the second drain electrode 235 of the first switching transistor 255 may be formed in the planarization layer 270. The planarization layer 270 may be formed sufficiently thick to cover the first and second source electrodes 210 and 215 and the first and second drain electrodes 230 and 235 on the insulating interlayer 190. In this case, the planarization layer 270 may have a substantially flat upper surface, and a planarization process may be further performed on the planarization layer 270 to implement the flat upper surface of the planarization layer 270. The planarization layer 270 may include organic materials or inorganic materials. In example embodiments, the planarization layer 270 may be formed using organic materials.

The lower electrode 290 may be formed on the planarization layer 270. The lower electrode 290 may be in direct contact with the second drain electrode 235 via the contact hole 275 of the planarization layer 270 to be electrically connected to the first switching transistor 255. The lower electrode 290 may be formed using a metal, a metal alloy, metal nitride, conductive metal oxide, transparent conductive materials, etc. These may be used alone or in a suitable combination thereof. Alternatively, the lower electrode 290 may have a multi-layered structure including a plurality of layers.

The pixel defining layer 310 may be on a portion of the lower electrode 290 and the planarization layer 270. The pixel defining layer 310 may cover both lateral portions of the lower electrode 290, and may have the opening 315 exposing a portion of an upper surface of the lower electrode 290. The pixel defining layer 310 may include organic materials or inorganic materials. In example embodiments, the pixel defining layer 310 may be formed using organic materials.

Figure 10:
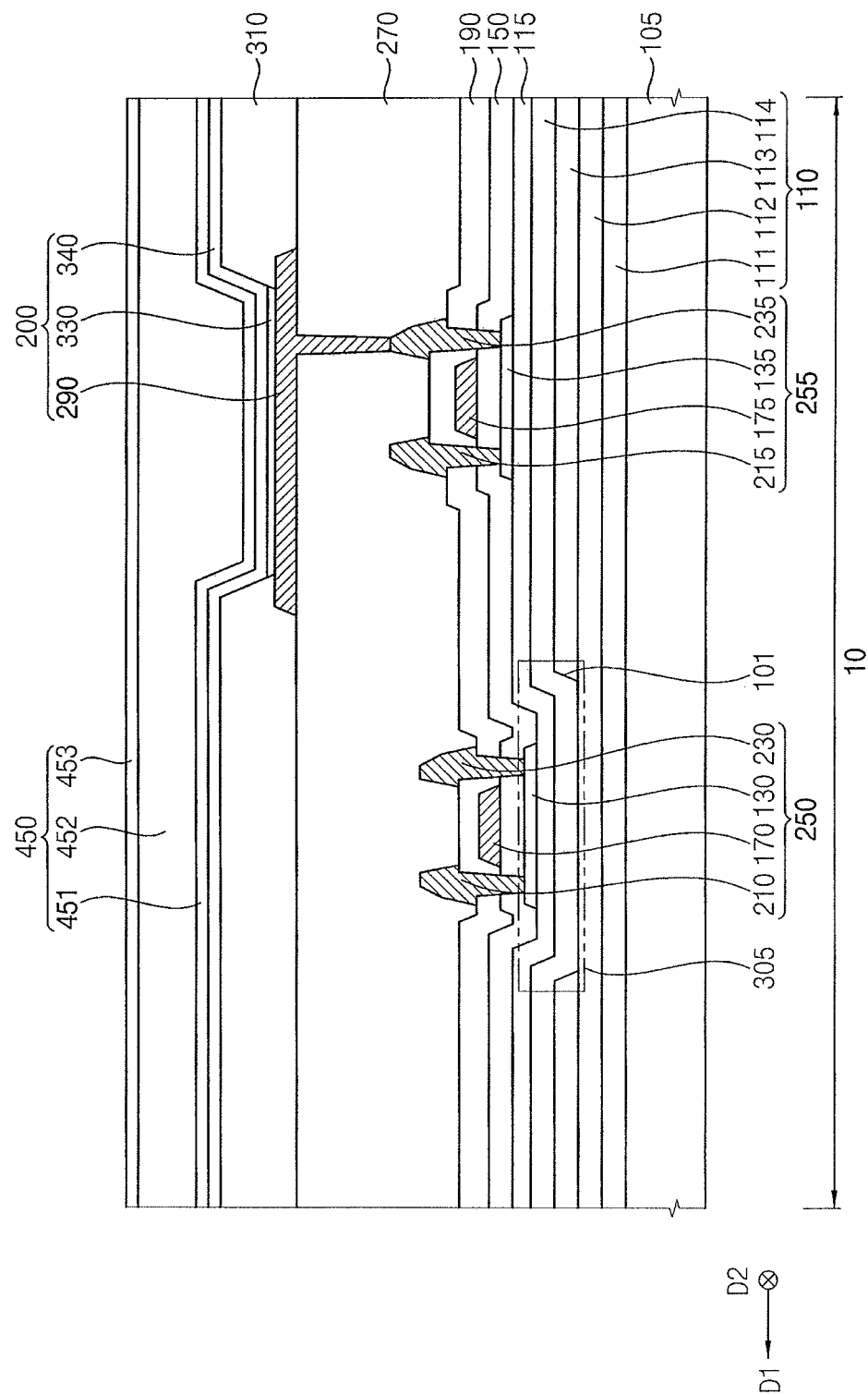

Referring to FIG. 10, the light emitting layer 330 may be formed on the lower electrode 290 exposed by the opening 315 in the pixel defining layer 310. The light emitting layer 330 may be formed using at least one of light emitting materials capable of generating different colors of light (e.g., red light, blue light, and green light, etc.) according to sub-pixels. Alternatively, the light emitting layer 330 may generally generate a white color of light by stacking a plurality of light emitting materials capable of generating different colors of light, e.g., red light, green light, blue light, etc. In this case, a color filter may be formed on the light emitting layer 330. The color filter may include at least one selected from a red color filter, a green color filter, and a blue color filter. Alternatively, the color filter may include a yellow color filter, a cyan color filter, and a magenta color filter. The color filter may be formed using a photosensitive resin, etc.

The upper electrode 340 may be formed on the pixel defining layer 310 and the light emitting layer 330. The upper electrode 340 may cover the light emitting layer 330 and the pixel defining layer 310, and may be formed on the entire substrate 110. The upper electrode 340 may be formed using a metal, a metal alloy, metal nitride, conductive metal oxide, transparent conductive materials, etc., alone or in a suitable combination thereof. Alternatively, the upper electrode 340 may have a multi-layered structure including a plurality of layers. Accordingly, a sub-pixel structure 200 may include the lower electrode 290, the light emitting layer 330, and the upper electrode 340.

The first TFE layer 451 may be formed on the upper electrode 340. The first TFE layer 451 may cover the upper electrode 340, and may be formed as a substantially uniform thickness along a profile of the upper electrode 340. The first TFE layer 451 may prevent the sub-pixel structure 200 from being deteriorated by the permeation of moisture, water, oxygen, etc. In addition, the first TFE layer 451 may protect the sub-pixel structure 200 from external impacts. The first TFE layer 451 may be formed using inorganic materials having flexibility.

The second TFE layer 452 may be formed on the first TFE layer 451. The second TFE layer 452 may improve the flatness of the OLED display device, and may protect the sub-pixel structure 200. The second TFE layer 452 may be formed using organic materials having flexibility.

The third TFE layer 453 may be formed on the second TFE layer 452. The third TFE layer 453 may cover the second TFE layer 452, and may have a substantially uniform thickness along a profile of the second TFE layer 452. The third TFE layer 453 together with the first TFE layer 451 and the second TFE layer 452 may prevent the sub-pixel structure 200 from being deteriorated by the permeation of contaminants, e.g., moisture, water, oxygen, etc. In addition, the third TFE layer 453 together with the first TFE layer 451 and the second TFE layer 452 may protect the sub-pixel structure 200 from external impacts. The third TFE layer 453 may be formed using inorganic materials having flexibility. Accordingly, a TFE structure 450 including the first TFE layer 451, the second TFE layer 452, and the third TFE layer 453 may be formed. Alternatively, the TFE structure 450 may have five layers structure where first through fifth TFE layers are stacked or seven layers structure where the first through seventh TFE layers are stacked.

After the TFE structure 450 is formed, the rigid glass substrate 105 may be removed from the substrate 110. Accordingly, the OLED display device 100 illustrated in FIG. 1 may be manufactured.

Figure 11:
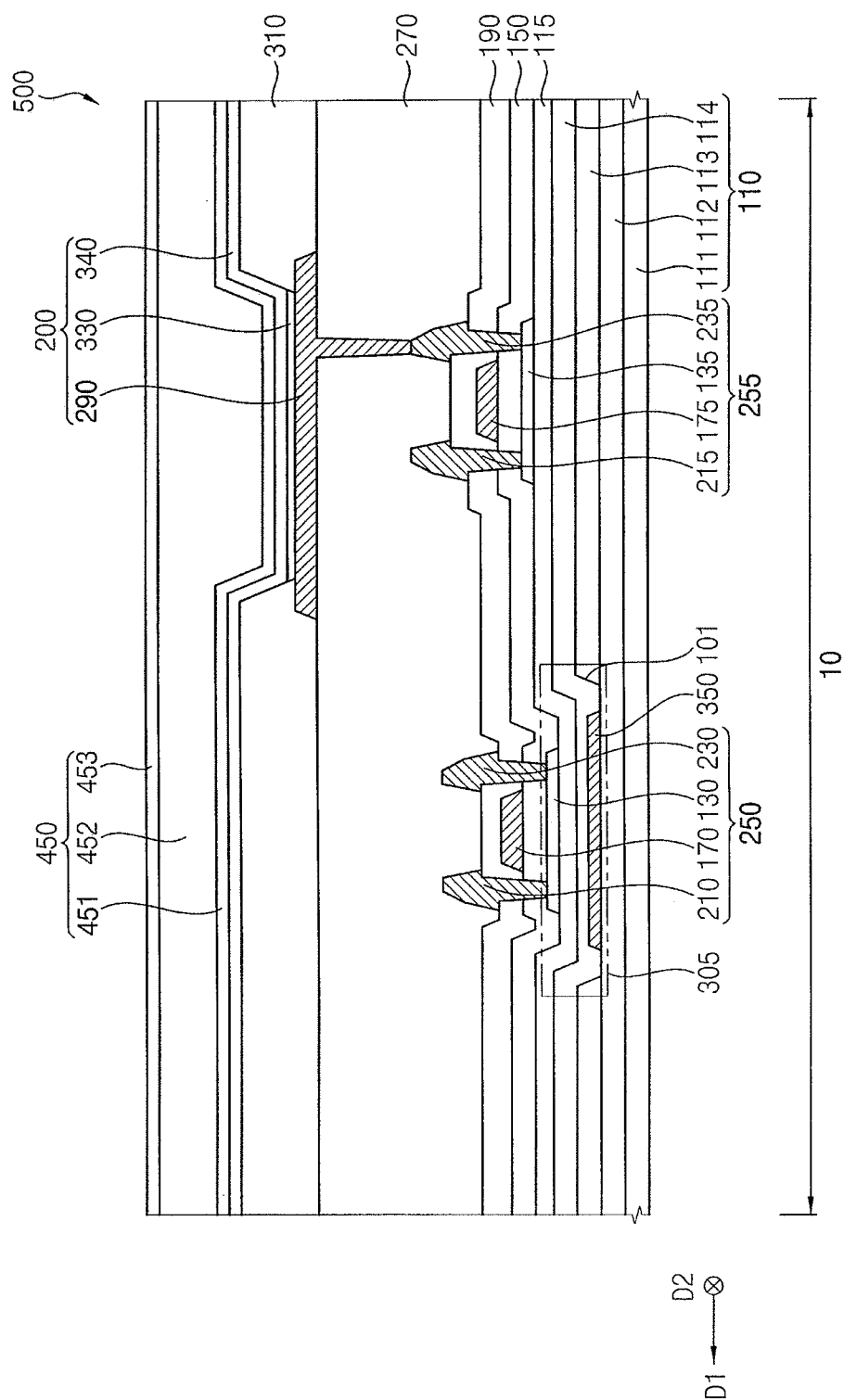
FIG. 11 illustrates a cross-sectional view of an OLED display device in accordance with example embodiments.

FIG. 11 is a cross-sectional view illustrating an OLED display device in accordance with example embodiments. An OLED display device 500 illustrated in FIG. 11 may have a configuration substantially the same as or similar to that of an OLED display device 100 described with reference to FIGS. 1 through 4 except for including a first lower block pattern 350. In FIG. 11, detailed descriptions for elements that are substantially the same as or similar to elements described with reference to FIGS. 1 through 4 may not be repeated.

Referring to FIG. 11, an OLED display device 500 may include the substrate 110, a first lower block pattern 350, the buffer layer 115, the gate insulation layer 150, the insulating interlayer 190, the driving transistor 250, the first switching transistor 255, the first trench 305, the planarization layer 270, the pixel defining layer 310, the sub-pixel structure 200, the TFE structure 450, etc. Here, the substrate 110 may include the first organic film layer 111, the first barrier layer 112, the second organic film layer 113, and the second barrier layer 114. The second organic film layer 113 may have the first opening 101. In example embodiments, the first trench 305 of the substrate 110 may be defined by the first opening 101 of the second organic film layer 113, and the first lower block pattern 350 may be buried in the internal substrate 110 under a the driving transistor 250.

The first lower block pattern 350 may be on the first barrier layer 112. In example embodiments, the first lower block pattern 350 may be in the first trench 305 between the first barrier layer 112 and the second barrier layer 114. The second barrier layer 114 may have a thickness along the first direction D3 on top of the first lower block pattern 350 than a remainder of the second barrier layer 114. The first lower block pattern 350 may extend further along the first direction D1 than the driving transistor 250 on both sides thereof.

A predetermined voltage may be applied to the first lower block pattern 350. As the voltage is applied to the first lower block pattern 350, the first lower block pattern 350 may relatively reduce that electric charges included in the substrate 110 interfere with driving the driving transistor 250. Alternatively, the first lower block pattern 350 may be grounded in an outer portion of the OLED display device 500. In this case, the electric charges included in the substrate 110 may be discharged to an outside through the first lower block pattern 350. That is, as the first lower block pattern 350 is grounded, the first lower block pattern 350 may relatively reduce that the electric charges included in the substrate 110 interfere with driving the driving transistor 250. The first lower block pattern 350 may include a metal, metal nitride, conductive metal oxide, transparent conductive materials, etc., alone or in a suitable combination thereof. Alternatively, the first lower block pattern 350 may have a multi-layered structure including a plurality of layers.

Figure 12:
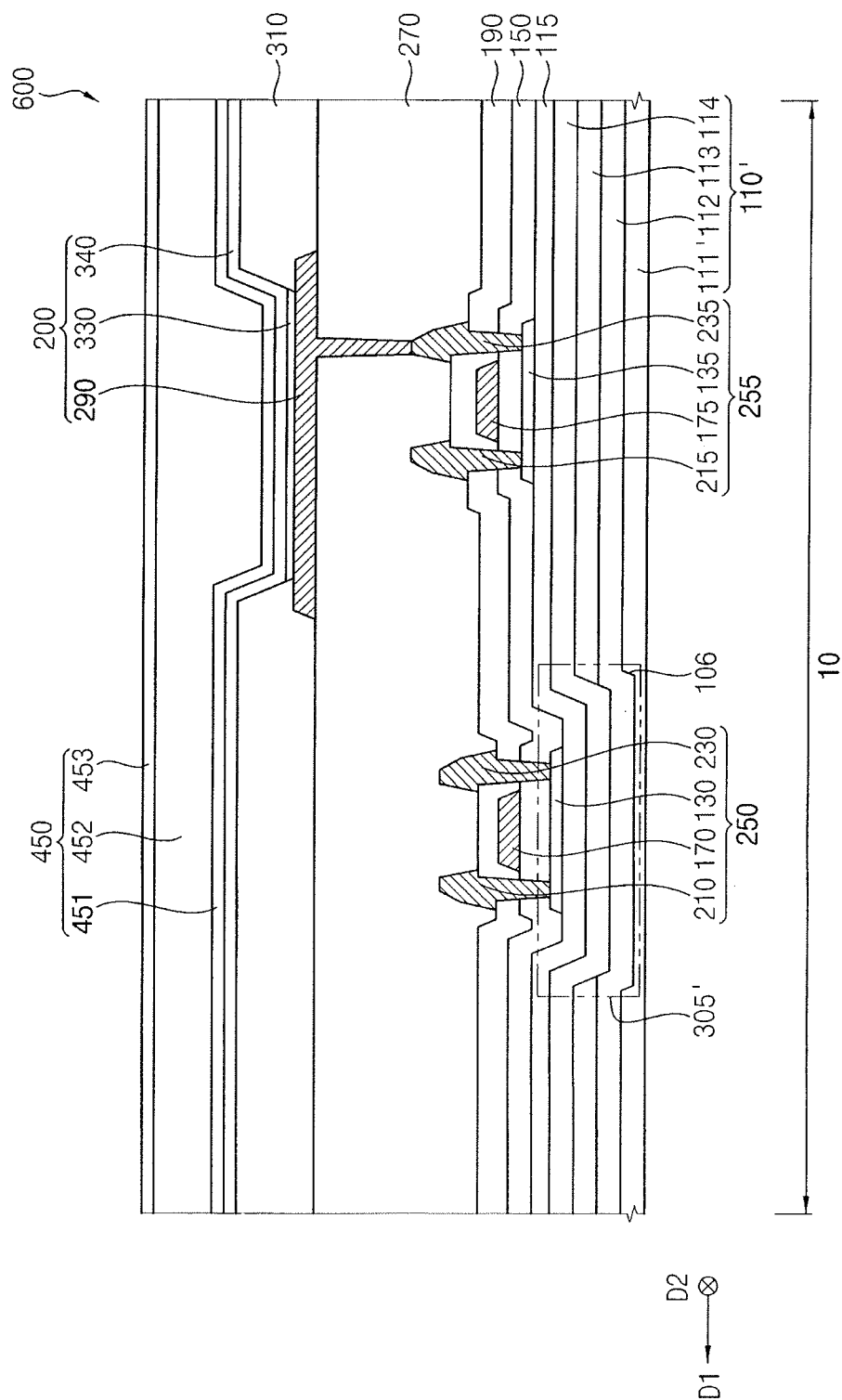
FIG. 12 illustrates a cross-sectional view of an OLED display device in accordance with example embodiments.

FIG. 12 is a cross-sectional view illustrating an OLED display device in accordance with example embodiments. An OLED display device 600 illustrated in FIG. 12 may have a configuration substantially the same as or similar to that of an OLED display device 100 described with reference to FIGS. 1 through 4 except for a first groove 106 of a first organic film layer 111. In FIG. 12, detailed descriptions for elements that are substantially the same as or similar to elements described with reference to FIGS. 1 through 4 may not be repeated.

Referring to FIG. 12, an OLED display device 600 may include the substrate 110, the buffer layer 115, the gate insulation layer 150, the insulating interlayer 190, the driving transistor 250, the first switching transistor 255, a first trench 305', the planarization layer 270, the pixel defining layer 310, the sub-pixel structure 200, the TFE structure 450, etc. Here, the substrate 110 may include a first organic film layer 111', the first barrier layer 112, the second organic film layer 113, and the second barrier layer 114. In addition, the second organic film layer 113 may have the first opening 101 and the first organic film layer 111 may have a first groove 106. In example embodiments, the first trench 305 of the substrate 110 may be defined by the first groove 106 of the first organic film layer 111 and the first opening 101 of the second organic film layer 113. In addition, the first barrier layer 112 may be in the first groove 106.

The first groove 106 may be formed by removing at least a portion of the first organic film layer 11. For example, a thickness of the first organic film layer 111 where the first groove 106 is formed may be less than or equal to about 1 micrometer. As the first groove 106 is formed by removing at least a portion of the first organic film layer 111, an affect from electric charges included in the first organic film layer 111 under the driving transistor 250 may be relatively reduced. In other words, as the first groove 106 is formed, the number of the electric charges included in the first organic film layer 111 under the driving transistor 250 may be reduced, and reliability and lifetime of the driving transistor 250 may be increased.

Figure 13:
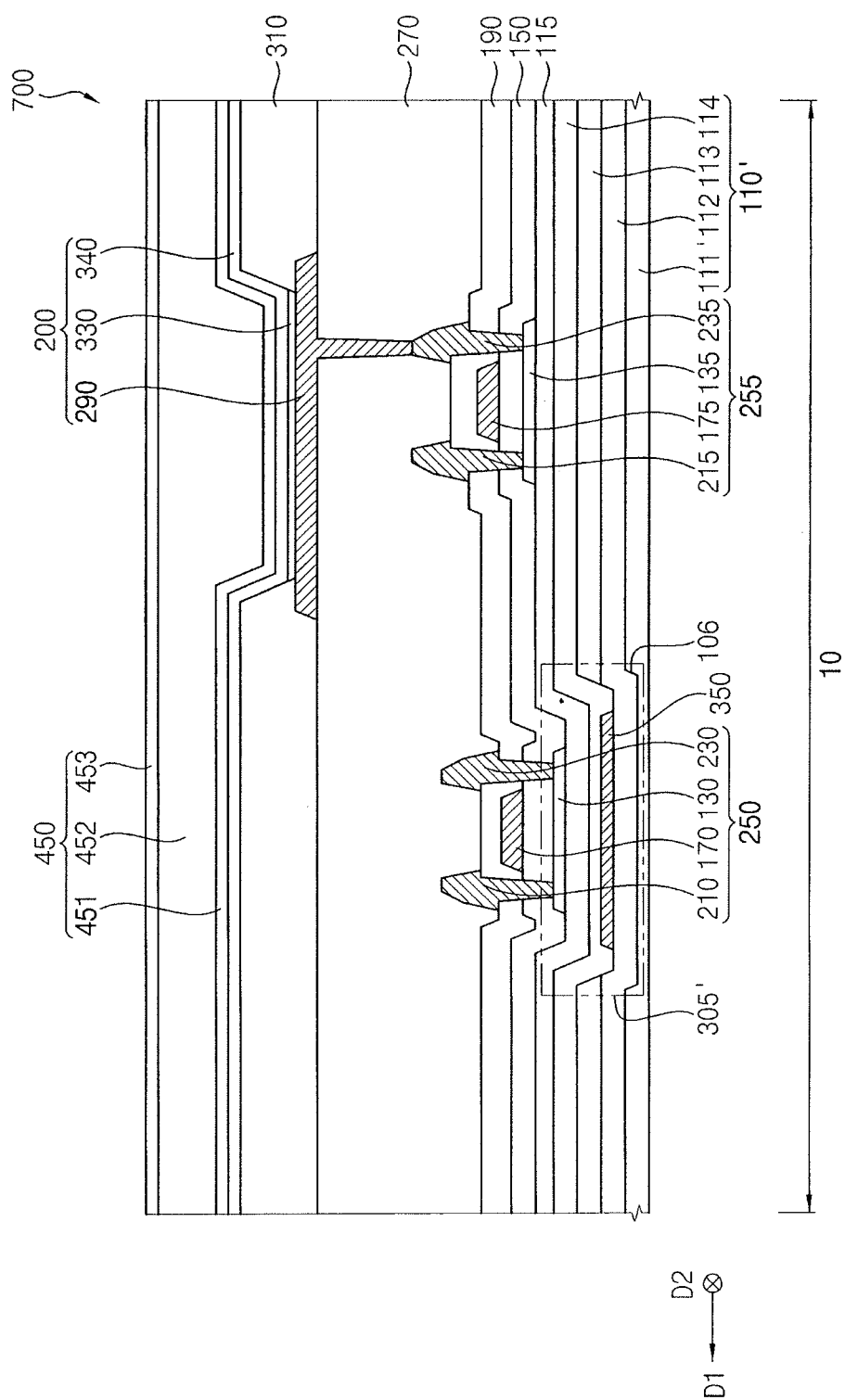
FIG. 13 illustrates a cross-sectional view of an OLED display device in accordance with example embodiments.

FIG. 13 is a cross-sectional view illustrating an OLED display device in accordance with example embodiments. An OLED display device 700 illustrated in FIG. 13 may have a configuration substantially the same as or similar to that of an OLED display device 600 described with reference to FIG. 12 except for including the first lower block pattern 350. In FIG. 13, detailed descriptions for elements that are substantially the same as or similar to elements described with reference to FIG. 12 may not be repeated.

Referring to FIG. 13, an OLED display device 700 may include the substrate 110, the first lower block pattern 350, the buffer layer 115, the gate insulation layer 150, the insulating interlayer 190, the driving transistor 250, the first switching transistor 255, the first trench 305', the planarization layer 270, the pixel defining layer 310, the sub-pixel structure 200, the TFE structure 450, etc. Here, the substrate 110 may include the first organic film layer 111', the first barrier layer 112, the second organic film layer 113, and the second barrier layer 114. In addition, the second organic film layer 113 may have the first opening 101 and the first organic film layer 111 may have the first groove 106. In example embodiments, the first trench 305 of the substrate 110 may be defined by the first groove 106 of the first organic film layer 111 and the first opening 101 of the second organic film layer 113. The first lower block pattern 350 may be buried in the internal substrate 110 under the driving transistor 250.

The first lower block pattern 350 may be on the first barrier layer 112. In example embodiments, the first lower block pattern 350 may be inside the first trench 305, and between the first barrier layer 112 and the second barrier layer 114. A predetermined voltage may be applied to the first lower block pattern 350. As the voltage is applied to the first lower block pattern 350, the first lower block pattern 350 may relatively reduce that electric charges included in the substrate 110 interfere with a drive of the driving transistor 250. Alternatively, the first lower block pattern 350 may be grounded in an outer portion of the OLED display device 700. In this case, the electric charges included in the substrate 110 may be discharged to an outside through the first lower block pattern 350. That is, as the first lower block pattern 350 is grounded, the first lower block pattern 350 may relatively reduce that the electric charges included in the substrate 110 interfere with a drive of the driving transistor 250.

Figure 14:
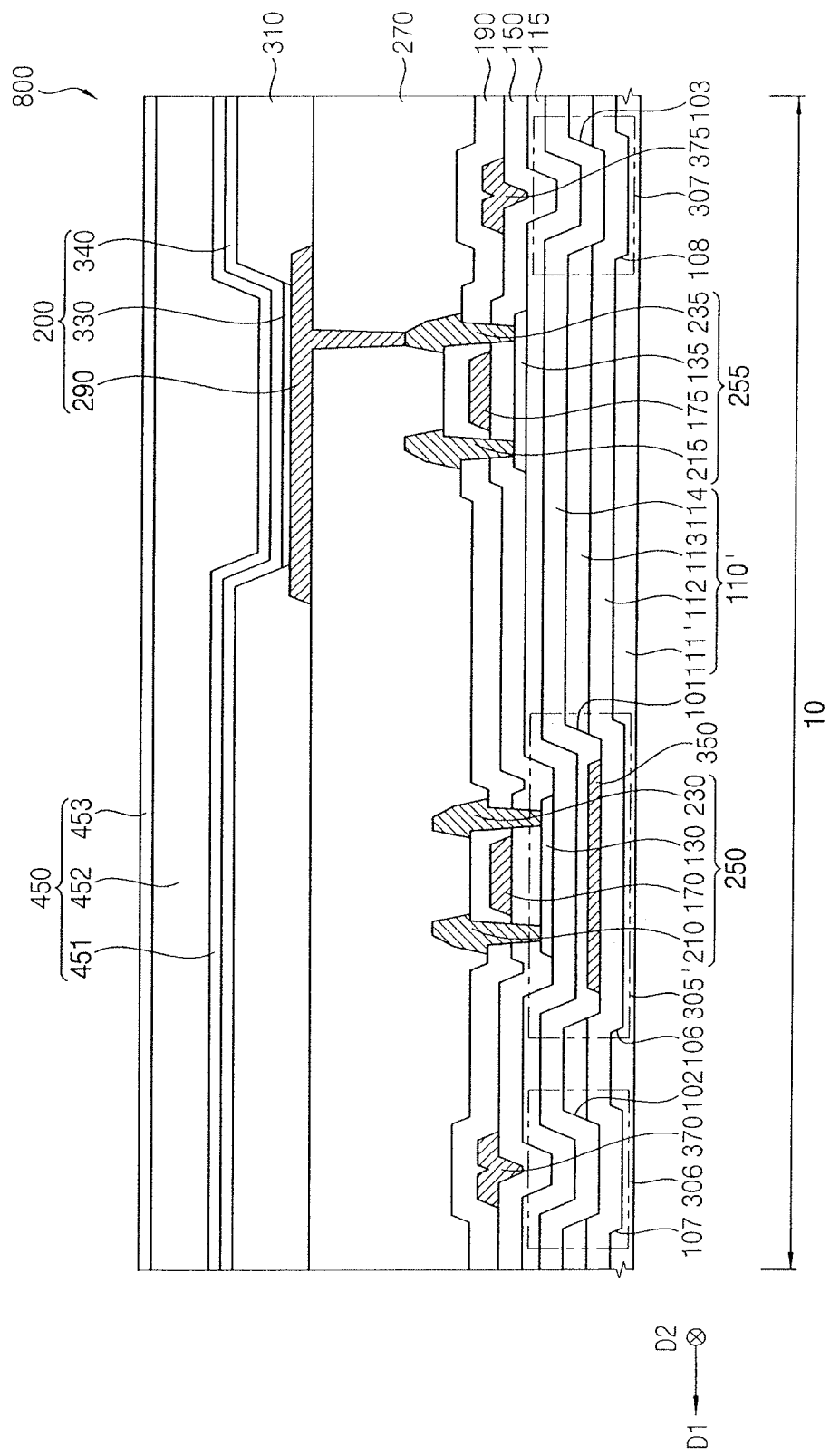
FIG. 14 illustrates a cross-sectional view of an OLED display device in accordance with example embodiments.

FIG. 14 is a cross-sectional view illustrating an OLED display device in accordance with example embodiments. An OLED display device 800 illustrated in FIG. 13 may have a configuration substantially the same as or similar to that of an OLED display device 700 described with reference to FIG. 13 except for a first signal wiring 370 and a second signal wiring 375. In FIG. 14, detailed descriptions for elements that are substantially the same as or similar to elements described with reference to FIG. 13 may not be repeated.

Referring to FIG. 14, an OLED display device 800 may include the substrate 110, the first lower block pattern 350, the buffer layer 115, the gate insulation layer 150, the insulating interlayer 190, the driving transistor 250, the first switching transistor 255, a first signal wiring 370, a second signal wiring 375, the first trench 305', a second trench 306, a third trench 307, the planarization layer 270, the pixel defining layer 310, the sub-pixel structure 200, the TFE structure 450, etc. The substrate 110 may include the first organic film layer 111', the first barrier layer 112, the second organic film layer 113, and the second barrier layer 114. The second organic film layer 113 may have the first opening 101, a second opening 102, and a third opening 103. The first organic film layer 111 may have the first groove 106, a second groove 107, and a third groove 108. Corresponding openings and groove may overlap one another along the third direction D3.

In example embodiments, the first trench 305 of the substrate 110 may be defined by the first groove 106 of the first organic film layer 111' and the first opening 101 of the second organic film layer 113, and the first lower block pattern 350 may be buried in the internal substrate 110 under the driving transistor 250. The second trench 306 of the substrate 110 may be defined by the second groove 107 of the first organic film layer 111' and the second opening 102 of the second organic film layer 113. The third trench 307 of the substrate 110 may be defined by the first groove 106 of the first organic film layer 111' and the third opening 103 of the second organic film layer 113. For example, the first trench 305 defined by the first groove 106 and the first opening 101 may be under the driving transistor 250. The second groove 107 may be spaced apart from the first groove 106 along the first direction D1, and the second opening 102 and the first signal wiring 370 may be on the second groove 107. The second groove 107 may be formed by removing at least a portion of the first organic film layer 111'. The third groove 108 may be spaced apart from the first groove 106 along the first direction D1 opposite the second groove 107, e.g., such that the first groove 106 is between the second groove 107 and the third groove 108, and the third opening 103 and the second signal wiring 375 may be on the third groove 108. The third groove 108 may be formed by removing at least a portion of the first organic film layer 111'.

The first signal wiring 370 may be inside the second trench 306 and a width of the second trench 306 may be less than a width of the first signal wiring 370. Alternatively, a width of the second trench 306 may be greater than a width of the first signal wiring 370. The first signal wiring 370 may include a data signal wiring, a scan signal wiring, a power supply voltage wiring, an emission signal wiring, an initialization signal wiring, and so forth. In example embodiments, the first signal wiring 370 may correspond to the emission signal wiring (e.g., the emission signal EM wiring of FIG. 4), and may have a first voltage level. The first signal wiring 370 may include a metal, metal nitride, conductive metal oxide, transparent conductive materials, etc., alone or in a suitable combination thereof. Alternatively, the first signal wiring 370 may have a multi-layered structure including a plurality of layers.

The second signal wiring 375 may be inside the third trench 307, and a width of the third trench 307 may be less than a width of the second signal wiring 375. Alternatively, a width of the third trench 307 may be greater than a width of the second signal wiring 375. The second signal wiring 375 may include a data signal wiring, a scan signal wiring, a power supply voltage wiring, an emission signal wiring, and an initialization signal wiring. In example embodiments, the second signal wiring 375 may correspond to the scan signal wiring (e.g., the scan signal GW wiring of FIG. 4), and may have a second voltage level. Here, the first voltage level may be less than the second voltage level. The second signal wiring 375 may include a metal, metal nitride, conductive metal oxide, transparent conductive materials, etc. These may be used alone or in a suitable combination thereof. Alternatively, the second signal wiring 375 may have a multi-layered structure including a plurality of layers.

For example, when the OLED display device 800 is driven, an electric field may be generated by a difference of the first voltage level of the first signal wiring 370 and the second voltage level of the second signal wiring 375, and the electric charges included in the substrate 110 may be non-uniformly distributed under transistors by the electric field. In example embodiments, as the second organic film layer 113 under each of the first signal wiring 370 and the second signal wiring 375 and at least a portion of the first organic film layer 111 are removed, an intensity of the electric field may be reduced. Accordingly, an effect of the electric charges with respect to the driving transistor 250 may be relatively reduced, and reliability and lifetime of the driving transistor 250 may be relatively increased.

Figure 15:
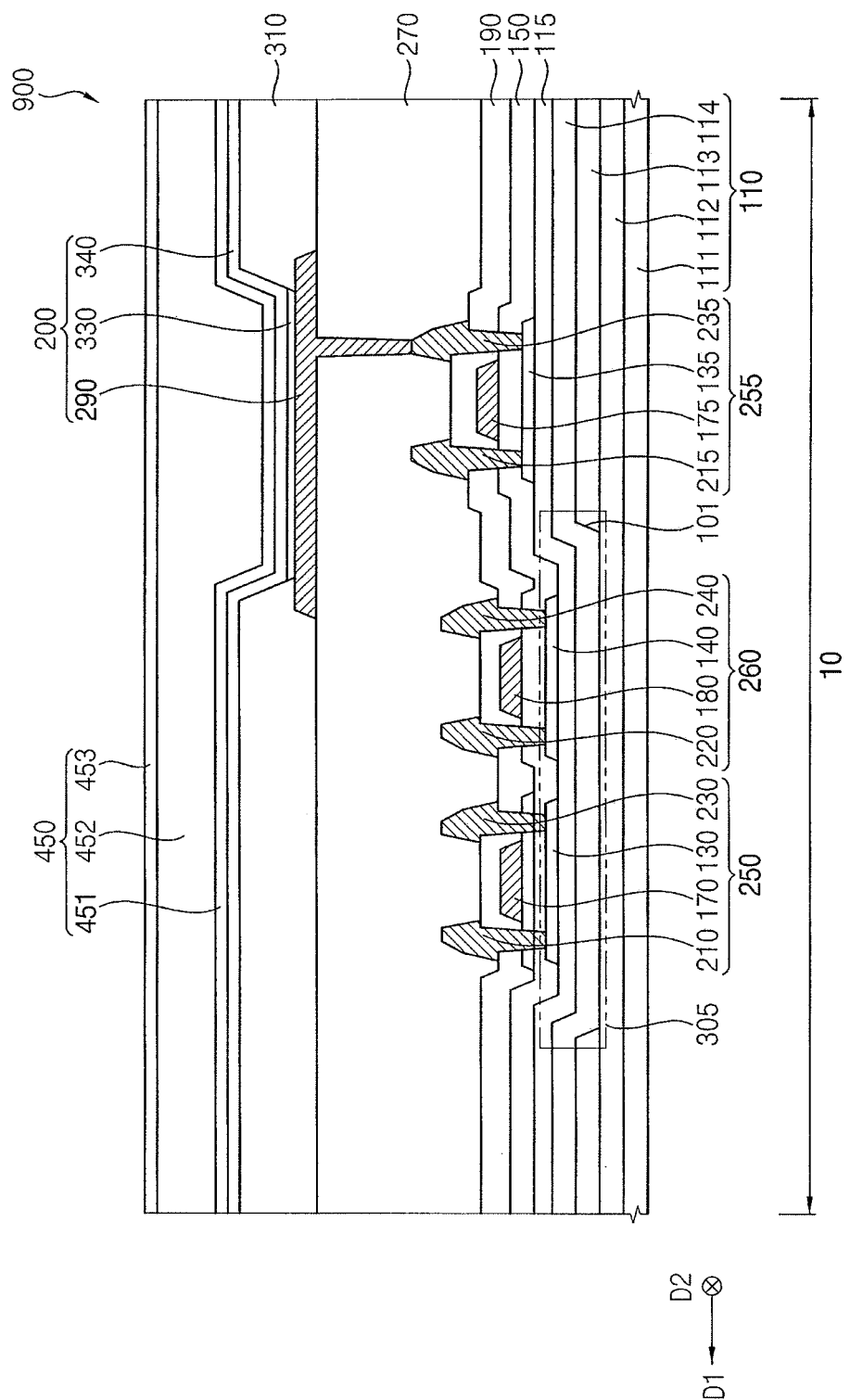
FIG. 15 illustrates a cross-sectional view of an OLED display device in accordance with example embodiments.

FIG. 15 is a cross-sectional view illustrating an OLED display device in accordance with example embodiments. An OLED display device 900 illustrated in FIG. 11 may have a configuration substantially the same as or similar to that of an OLED display device 100 described with reference to FIGS. 1 through 4 except for including a second switching transistor 260. In FIG. 15, detailed descriptions for elements that are substantially the same as or similar to elements described with reference to FIGS. 1 through 4 may not be repeated.

Referring to FIG. 15, an OLED display device 900 may include the substrate 110, the buffer layer 115, the gate insulation layer 150, the insulating interlayer 190, the driving transistor 250, the first switching transistor 255, a second switching transistor 260, the first trench 305, a planarization layer 270, a pixel defining layer 310, a sub-pixel structure 200, the TFE structure 450, etc. Here, the substrate 110 may include the first organic film layer 111, the first barrier layer 112, the second organic film layer 113, and the second barrier layer 114, The second organic film layer 113 may have a first opening 101.

The driving transistor 250 may include the first active layer 130, the first gate electrode 170, the first source electrode 210, and the first drain electrode 230. The first switching transistor 255 may include the second active layer 135, the second gate electrode 175, the second source electrode 215, and the second drain electrode 235. The second switching transistor 260 may include a third active layer 140, a third gate electrode 180, a third source electrode 220, and a third drain electrode 240. In example embodiments, the first trench 305 of the substrate 110 may be defined by the first opening 101 of the second organic film layer 113, and the driving transistor 250 and the second switching transistor 260 may be in the first trench 305.

The second switching transistor 260 may be spaced apart from the driving transistor 250 along the first direction D1 in the first trench 305. In example embodiments, the driving transistor 250 may correspond to the first transistor TR1 of FIG. 4, the first switching transistor 255 may correspond to the seventh transistor TR7 of FIG. 4, and the second switching transistor 260 may correspond to the third transistor TR3_1 of FIG. 4.

As illustrated in FIG. 4, the first transistor TR1 may generate the driving current ID based on a voltage difference of the gate terminal and the source terminal, and a gradation may be implemented based on the amount of the driving current ID generated by the first transistor TR1. That is, compared to the second through seventh transistors TR2, TR3_1, TR3_2, TR4_1, TR4_2, TR5, TR_6, and TR7, the first transistor TR1 may have the largest influence with respect to light emission of the OLED. Meanwhile, the third transistor TR3_1 among the second through seventh transistors TR2, TR3_1, TR3_2, TR4_1, TR4_2, TR5, TR_6, and TR7 may have the second off largest influence with respect to an emission of the OLED (see Table 1). In example embodiments, as illustrated in FIG. 15, the first transistor TR1 (e.g., the driving transistor 250) and the third transistor TR3_1 (e.g., second switching transistor 260) that have a relatively large influence with respect to the emission of the OLED may be in the first trench 305 and spaced apart from each other. Accordingly, a display quality of the OLED display device 900 may be increased.

TABLE 1

| | ΔVth | | | |
|---|---|---|---|---|
| | 0.0 | 1.0 | 2.0 | 3.0 |
| TR3_1 | 0.0% | −1.4% | −2.1% | −2.8% |
| TR3_2 | 0.0% | −0.7% | −0.7% | −0.7% |
| T4_1 | 0.0% | −0.7% | −0.7% | −0.7% |
| T4_2 | 0.0% | −0.7% | −0.7% | −0.7% |
| TR2 | 0.0% | −0.7% | −0.7% | −0.7% |
| TR5 | 0.0% | 0.0% | 0.0% | −0.7% |
| TR6 | 0.0% | −0.7% | −0.7% | −1.4% |
| TR7 | 0.0% | −0.7% | −0.7% | −0.7% |

Table 1 is a table showing rate of luminance change of OLED as a threshold voltage of each of transistors, other than the driving transistor, is changed. As described above, the third transistor TR3_1 may have a relatively large influence with respect to the light emission of the OLED.

Figure 16:
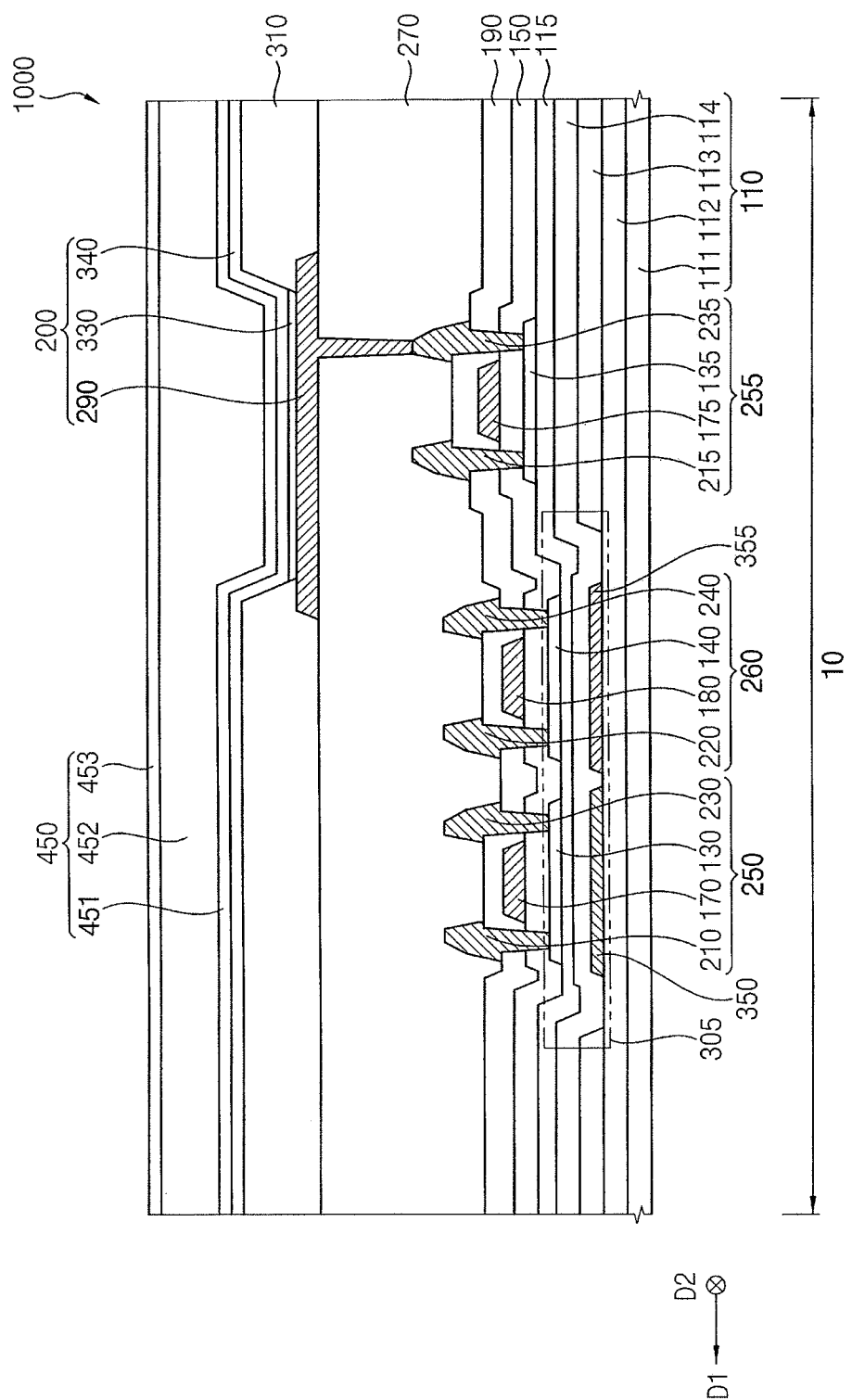
FIG. 16 illustrates a cross-sectional view of an OLED display device in accordance with example embodiments.
Figure 17:
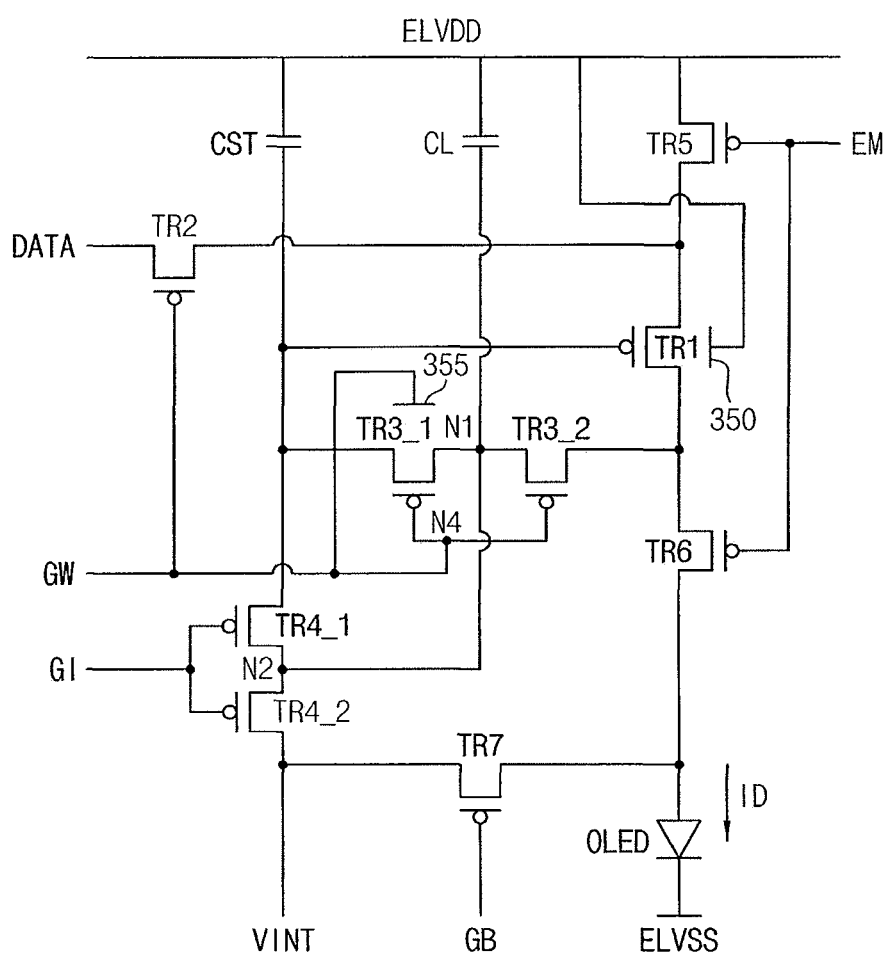
FIG. 17 illustrates a circuit diagram for describing an OLED and transistors included in the OLED display device of FIG. 16.

FIG. 16 is a cross-sectional view illustrating an OLED display device in accordance with example embodiments. FIG. 17 is a circuit diagram for describing an OLED and transistors included in the OLED display device of FIG. 16. An OLED display device 1000 illustrated in FIG. 16 may have a configuration substantially the same as or similar to that of an OLED display device 100 described with reference to FIG. 15 except for including the first lower block pattern 350 and a second lower block pattern 355. In FIG. 16, detailed descriptions for elements that are substantially the same as or similar to elements described with reference to FIG. 15 may not be repeated.

Referring to FIG. 16, an OLED display device 1000 may include the substrate 110, the first lower block pattern 350, the second lower block pattern 355, the buffer layer 115, the gate insulation layer 150, the insulating interlayer 190, the driving transistor 250, the first switching transistor 255, the second switching transistor 260, the first trench 305, the planarization layer 270, the pixel defining layer 310, the sub-pixel structure 200, the TFE structure 450, etc. Here, the substrate 110 may include the first organic film layer 111, the first barrier layer 112, the second organic film layer 113, and the second barrier layer 114, and the second organic film layer 113 may have the first opening 101. In example embodiments, the first trench 305 of the substrate 110 may be defined by the first opening 101 of the second organic film layer 113, and the first lower block pattern 350 may be buried in the internal substrate 110 under the driving transistor 250. The second lower block pattern 355 may be buried in the internal substrate 110 under the second switching transistor 260.

The first lower block pattern 350 and the second lower block pattern 355 may be on the first barrier layer 112. In example embodiments, the first lower block pattern 350 and the second lower block pattern 355 may be in the first trench 305, and may be between the first barrier layer 112 and the second barrier layer 114. A predetermined voltage may be applied to each of the first and second lower block patterns 350 and 355. As the voltage is applied to each of the first and second lower block patterns 350 and 355, the first and second lower block patterns 350 and 355 may relatively reduce that electric charges included in the substrate 110 interfere with a drive of the driving transistor 250 and the second switching transistor 260.

Each of the first and second lower block patterns 350 and 355 may include a metal, metal nitride, conductive metal oxide, transparent conductive materials, etc., alone or in a suitable combination thereof. Alternatively, each of the first and second lower block patterns 350 and 355 may have a multi-layered structure including a plurality of layers.

Referring to FIG. 17, the driving transistor 250 of FIG. 16 may correspond to a first transistor TR1 of FIG. 17, and the second switching transistor 260 of FIG. 16 may correspond to a third transistor TR3_1 of FIG. 17. In addition, the first lower block pattern 350 of FIG. 16 may correspond to a first back gate 350 of FIG. 17, and the second lower block pattern 355 of FIG. 16 may correspond to a second back gate 355 of FIG. 17.

As illustrated in FIG. 17, the first back gate 350 may be connected to a second power supply voltage ELVDD wiring and a second power supply voltage ELVDD may be applied to the first back gate 350. In other words, a constant voltage may be applied to the first back gate 350. Alternatively, the first back gate 350 may be connected to a wiring where a constant voltage of 1 volt or more is applied. The second back gate 355 may be connected to a scan signal GW wiring and a scan signal GW may be applied to the second back gate 355. Additionally, to improve circuit characteristics (e.g., characteristics for blocking a leakage current), a first node N1 between third transistors TR3_1 and TR3_2 may be connected to a second node N2 between fourth transistors TR4_1 and TR4_2.

Embodiments may be applied to various display devices including an OLED display device. For example, embodiments may be applied to vehicle-display device, a ship-display device, an aircraft-display device, portable communication devices, display devices for display or for information transfer, a medical-display device, etc.

By way of summation and review, when the lower substrate of the OLED display device includes a polyimide substrate, electric charges may interfere with driving transistors because the polyimide substrate includes the relatively large number of the electric charges than a glass substrate. However, according to embodiments, by removing a portion of the substrate under the driving transistors, this effect may be reduced. For example, as the OLED display device in accordance with example embodiments includes a driving transistor in a first trench, the driving transistor may receive a relatively small effect on non-uniformly distributed electric charges. Accordingly, reliability and lifetime of the driving transistor included in the OLED display device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode (OLED) display device, comprising:
   a substrate having a first trench defined by a first opening in an organic layer of the substrate;
   a driving transistor disposed on the substrate and inside the first trench of the substrate, wherein a width of the first trench is greater than a width of the driving transistor; and
   a sub-pixel structure on the driving transistor.

2. The OLED display device as claimed in claim 1, further comprising:
   a first lower block pattern under the driving transistor, the first lower block pattern being buried in the substrate.

3. The OLED display device as claimed in claim 1, further comprising:
   a first switching transistor on the substrate, wherein the driving transistor is at a lower level than the first switching transistor.

4. The OLED display device as claimed in claim 1, wherein the substrate includes:
   a first organic film layer;
   a first barrier layer on the first organic film layer;
   a second organic film layer on the first barrier layer, the second organic film layer having the first opening in which the driving transistor is located; and
   a second barrier layer on the second organic film layer.

5. The OLED display device as claimed in claim 4, wherein the first trench of the substrate is defined by the first opening of the second organic film layer.

6. The OLED display device as claimed in claim 5, wherein the second barrier layer is in the first opening of the second organic film layer.

7. The OLED display device as claimed in claim 4, further comprising:
   a first switching transistor on the substrate,
   wherein the driving transistor is at a lower level than the first switching transistor, and the first and second organic film layers of the substrate are under the driving transistor.

8. The OLED display device as claimed in claim 7, further comprising:
   a second switching transistor inside the first trench, the second switching transistor being spaced apart from the driving transistor.

9. The OLED display device as claimed in claim 8, further comprising:
   a first lower block pattern inside the first trench under the driving transistor, the first lower block pattern being between the first barrier layer and the second barrier layer; and
   a second lower block pattern inside the first trench under the second switching transistor, the second lower block pattern being between the first barrier layer and the second barrier layer.

10. The OLED display device as claimed in claim 4, wherein the first organic film layer further includes:
    a first groove under the driving transistor.

11. The OLED display device as claimed in claim 10, wherein the first barrier layer is in the first groove.

12. The OLED display device as claimed in claim 10, wherein the first trench of the substrate is defined by the first groove of the first organic film layer and the first opening of the second organic film layer.

13. The OLED display device as claimed in claim 10, further comprising:
    a first switching transistor on the substrate, the first switching transistor being at a higher level than the driving transistor; and
    a first lower block pattern under the driving transistor, the first lower block pattern being between the first barrier layer and the second barrier layer.

14. The OLED display device as claimed in claim 10, wherein the first organic film layer further includes:
- a second groove spaced apart from the first groove in a first direction; and
- a third groove spaced apart from the first groove in a second direction opposite the first direction such that the first groove is between the second groove and the third groove.

15. The OLED display device as claimed in claim 14, wherein the second organic film layer further includes:
- a second opening that overlaps the second groove; and
- a third opening that overlaps the third groove, wherein the first barrier layer is in the second and third grooves.

16. The OLED display device as claimed in claim 15, wherein:
- a second trench of the substrate is defined by the second groove of the first organic film layer and the second opening of the second organic film layer, and
- a third trench of the substrate is defined by the third groove of the first organic film layer and the third opening of the second organic film layer.

17. The OLED display device as claimed in claim 16, further comprising:
- a first signal wiring on the second trench; and
- a second signal wiring the third trench, wherein a voltage level of the first signal is less than a voltage level of the second signal wiring.

18. The OLED display device as claimed in claim 17, wherein the first organic film layer including the first, second, third grooves is only under the driving transistor, the first signal wiring, and the second signal wiring.

19. The OLED display device as claimed in claim 1, further comprising:
- a thin film encapsulation structure on the sub-pixel structure,
- wherein the substrate and the thin film encapsulation structure have flexibility.

* * * * *